United States Patent
Nakano

(10) Patent No.: US 11,670,633 B2
(45) Date of Patent: *Jun. 6, 2023

(54) SEMICONDUCTOR DEVICE AND SEMICONDUCTOR MODULE

(71) Applicant: ROHM CO., LTD., Kyoto (JP)

(72) Inventor: Yuki Nakano, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 17/938,592

(22) Filed: Oct. 6, 2022

(65) Prior Publication Data

US 2023/0025858 A1 Jan. 26, 2023

Related U.S. Application Data

(63) Continuation of application No. 17/573,203, filed on Jan. 11, 2022, now Pat. No. 11,495,595, which is a (Continued)

(30) Foreign Application Priority Data

Feb. 13, 2015 (JP) .................................. 2015-26756

(51) Int. Cl.
  *H01L 27/06* (2006.01)
  *H01L 29/16* (2006.01)
  (Continued)

(52) U.S. Cl.
  CPC .......... *H01L 27/0629* (2013.01); *H01L 23/34* (2013.01); *H01L 29/16* (2013.01);
  (Continued)

(58) Field of Classification Search
  CPC ................ H01L 23/34; H01L 27/0629; H01L 29/0692; H01L 29/16; H01L 29/1608;
  (Continued)

(56) References Cited

U.S. PATENT DOCUMENTS

| | | |
|---|---|---|
| 4,903,106 A | 2/1990 | Fukunaga et al. |
| 5,304,837 A | 4/1994 | Hierold |

(Continued)

FOREIGN PATENT DOCUMENTS

| | | |
|---|---|---|
| CN | 101288179 | 5/2010 |
| CN | 105103290 | 11/2015 |

(Continued)

OTHER PUBLICATIONS

Machine translation of Asai Japanese Patent Document JP 2008172132 A Jul. 2008 (Year: 2008).*

(Continued)

*Primary Examiner* — Kevin J Comber
(74) *Attorney, Agent, or Firm* — Hamre, Schumann, Mueller & Larson, P.C.

(57) ABSTRACT

The semiconductor device of the present invention includes a semiconductor substrate, a switching element which is defined on the semiconductor substrate, and a temperature sense element which is provided on the surface of the semiconductor substrate independently from the switching element and characterized by being dependent on a temperature.

16 Claims, 18 Drawing Sheets

Related U.S. Application Data continuation of application No. 16/228,015, filed on Dec. 20, 2018, now Pat. No. 11,257,812, which is a continuation of application No. 15/019,579, filed on Feb. 9, 2016, now Pat. No. 10,199,371.

(51) Int. Cl.
*H01L 23/34* (2006.01)
*H01L 29/66* (2006.01)
*H01L 29/861* (2006.01)
H01L 29/06 (2006.01)
H01L 29/20 (2006.01)

(52) U.S. Cl.
CPC .... *H01L 29/1608* (2013.01); *H01L 29/66068* (2013.01); *H01L 29/861* (2013.01); *H01L 29/8611* (2013.01); H01L 29/0692 (2013.01); H01L 29/2003 (2013.01)

(58) Field of Classification Search
CPC ........... H01L 29/2003; H01L 29/66068; H01L 29/8611
USPC ....................................................... 361/93.8
See application file for complete search history.

(56) References Cited

U.S. PATENT DOCUMENTS

| | | | |
|---|---|---|---|
| 5,831,287 A | 11/1998 | Bakowski et al. | |
| 5,969,927 A | 10/1999 | Schirmer et al. | |
| 6,046,470 A | 4/2000 | Williams et al. | |
| 6,323,518 B1* | 11/2001 | Sakamoto | H01L 29/7803 257/E27.06 |
| 6,628,491 B1 | 9/2003 | Tihanyi et al. | |
| 7,129,557 B2 | 10/2006 | Berndlmaier et al. | |
| 7,808,067 B2 | 10/2010 | Stecher et al. | |
| 8,283,721 B2 | 10/2012 | Nakano | |
| 8,508,258 B2 | 8/2013 | Ishikawa et al. | |
| 8,785,931 B2 | 7/2014 | Kinouchi et al. | |
| 8,796,807 B2 | 8/2014 | Stephan et al. | |
| 9,716,052 B2 | 7/2017 | Osaga et al. | |
| 2002/0014639 A1* | 2/2002 | Imai | H01L 27/1203 257/E23.08 |
| 2005/0062048 A1 | 3/2005 | Hayashi et al. | |
| 2007/0023830 A1 | 2/2007 | Pfirsch et al. | |
| 2008/0203389 A1 | 8/2008 | Ozoe et al. | |
| 2008/0237772 A1* | 10/2008 | Stecher | H01L 25/16 438/54 |
| 2009/0218621 A1 | 9/2009 | Pfirsch et al. | |
| 2009/0261445 A1 | 10/2009 | Sugino | |
| 2011/0215400 A1* | 9/2011 | Nakamura | H01L 24/40 257/334 |
| 2013/0153900 A1* | 6/2013 | Kinouchi | G01K 7/01 257/48 |
| 2013/0314834 A1 | 11/2013 | Tamaki et al. | |
| 2014/0103364 A1 | 4/2014 | Nakano et al. | |
| 2014/0319540 A1 | 10/2014 | Sugimoto | |
| 2016/0056144 A1 | 2/2016 | Yao et al. | |
| 2016/0126156 A1 | 5/2016 | Osaga et al. | |
| 2016/0241018 A1 | 8/2016 | Nakano | |

FOREIGN PATENT DOCUMENTS

| | | |
|---|---|---|
| CN | 105518865 | 4/2016 |
| JP | H0750303 | 2/1995 |
| JP | H07153920 | 6/1995 |
| JP | 2002280556 | 9/2002 |
| JP | 2004319861 A | 11/2004 |
| JP | 2005175357 | 6/2005 |
| JP | 2006302977 | 11/2006 |
| JP | 2007142138 | 6/2007 |
| JP | 2007529115 | 10/2007 |
| JP | 2008172132 | 7/2008 |
| JP | 2008172132 A * | 7/2008 |
| JP | 2008177250 | 7/2008 |
| JP | 2008235600 | 10/2008 |
| JP | 2009503830 | 1/2009 |
| JP | 2011155289 | 8/2011 |
| JP | 2011187650 | 9/2011 |
| JP | 2012129503 A | 7/2012 |
| JP | 2012195339 | 10/2012 |
| JP | 2013033970 | 2/2013 |
| JP | 2013074264 | 4/2013 |
| JP | 2013201357 | 10/2013 |
| JP | 2013247804 | 12/2013 |
| JP | 2014003095 | 1/2014 |
| JP | 2014127487 | 7/2014 |
| JP | 2014216465 | 11/2014 |
| KR | 20020075197 | 10/2002 |
| WO | 2013161753 A1 | 10/2013 |
| WO | 2014199558 | 12/2014 |
| WO | 2015029159 | 3/2015 |

OTHER PUBLICATIONS

Notice of Reasons for Refusal issued for Japanese Patent Application No. 2021-209823, dated Dec. 8, 2022, 7 pages including English machine translation.
Office Action issued for Japanese Patent Application No. 2015-026756, dated Oct. 4, 2018, 12 pages including English translation.
Office Action issued for Japanese Patent Application No. 2019-089080, dated Feb. 20, 2020, 10 pages including English machine translation.
International Rectifier IRLBD59N04E datasheet, Nov. 13, 2001 (Year: 2001) 9 pages.
Office Action issued for Japanese Patent Application No. 2020-167510, dated Jun. 17, 2021, 8 pages including English translation.

* cited by examiner

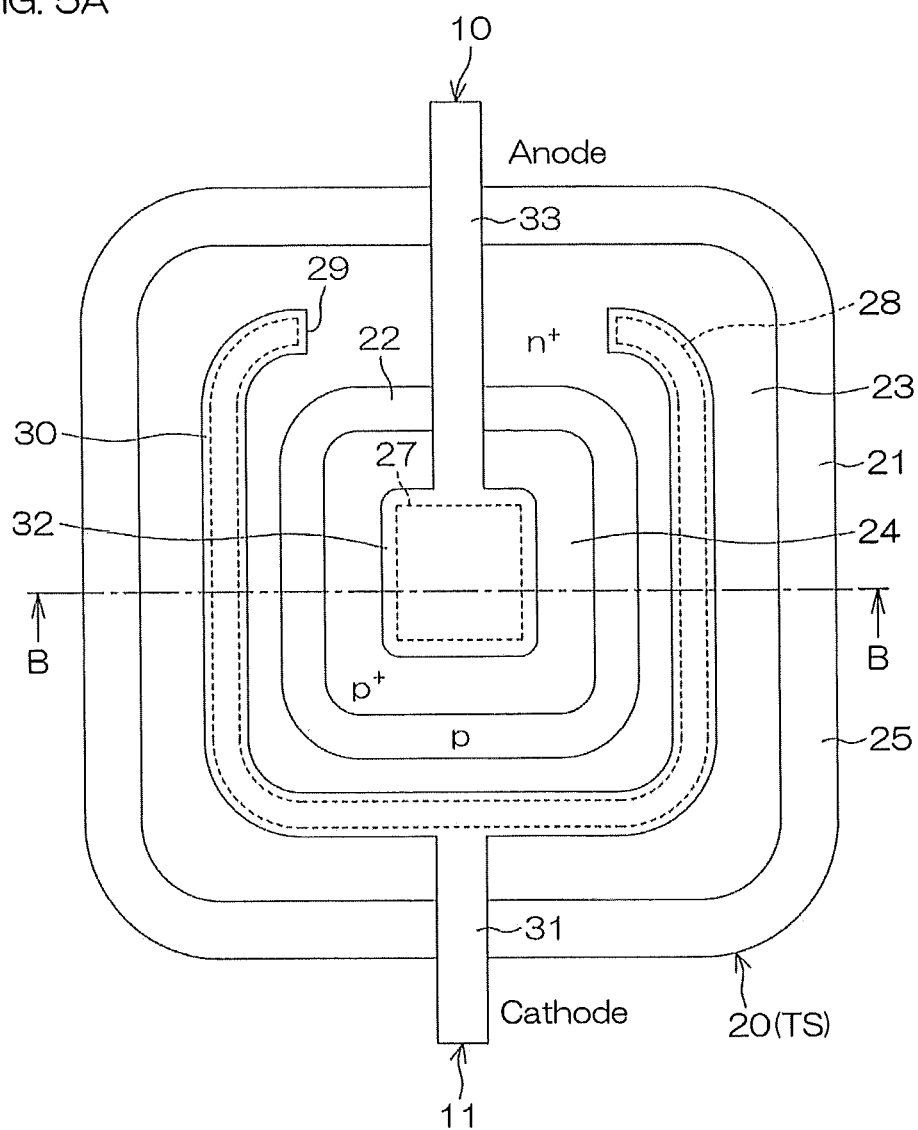

FIG. 10 (Serial connection)
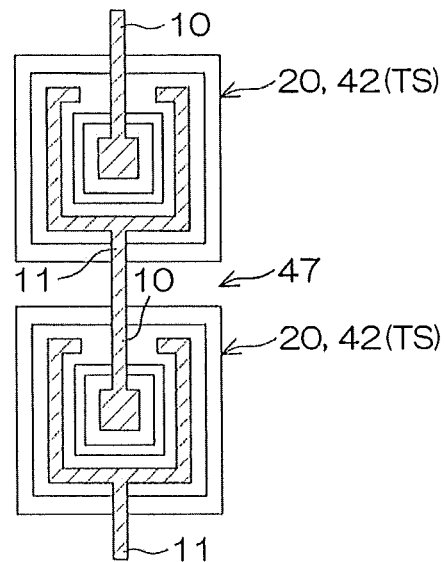
FIG. 11 (Serial connection + Reverse parallel connection)
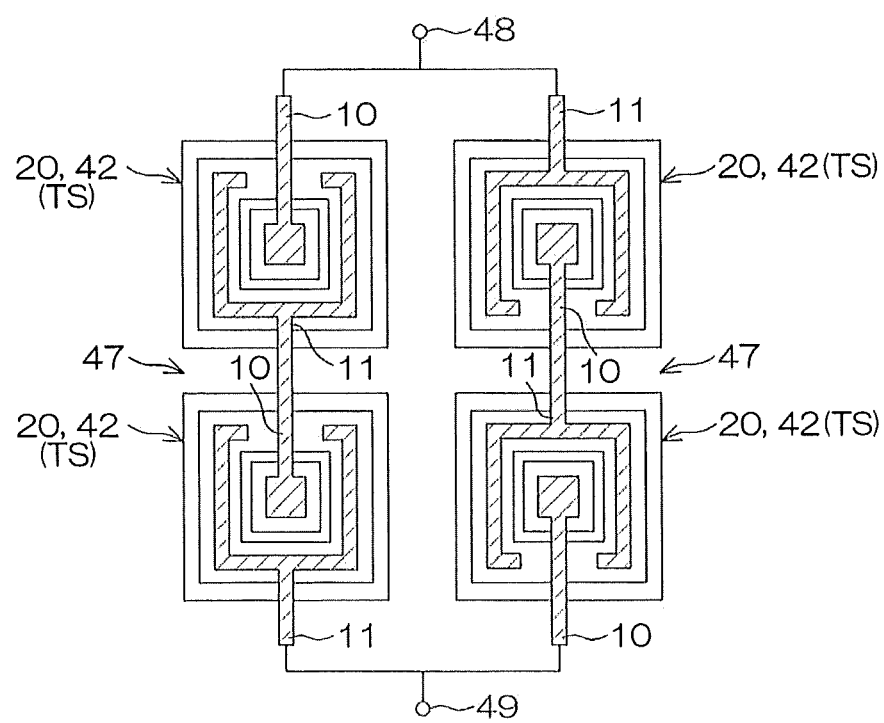

FIG. 12 (Reverse-series connection)
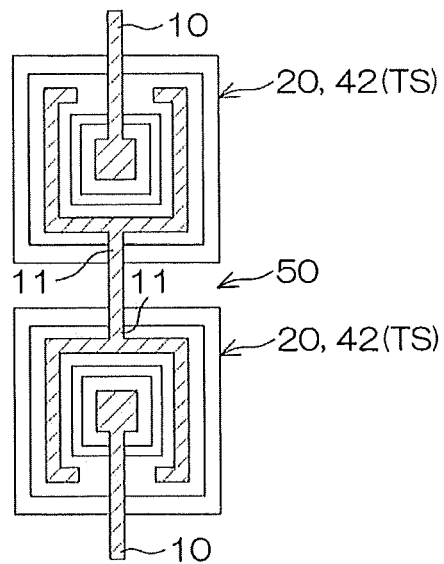
FIG. 13 (Plurality of reverse-series connections)
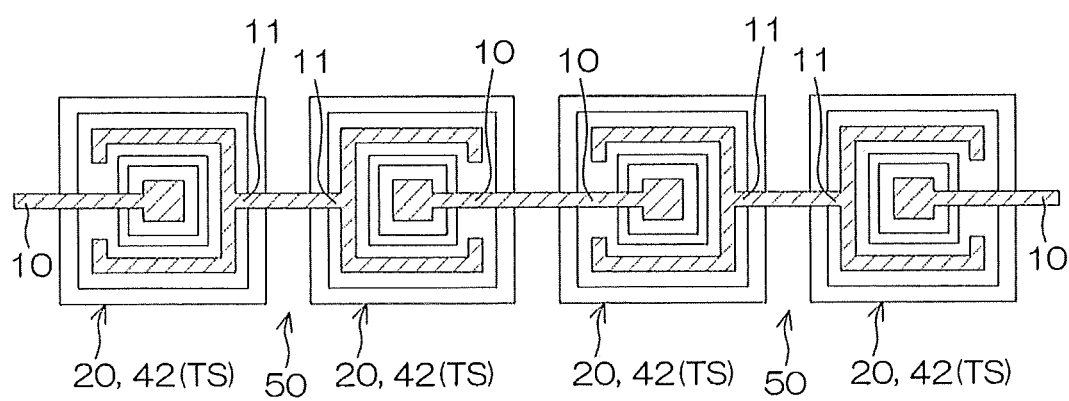

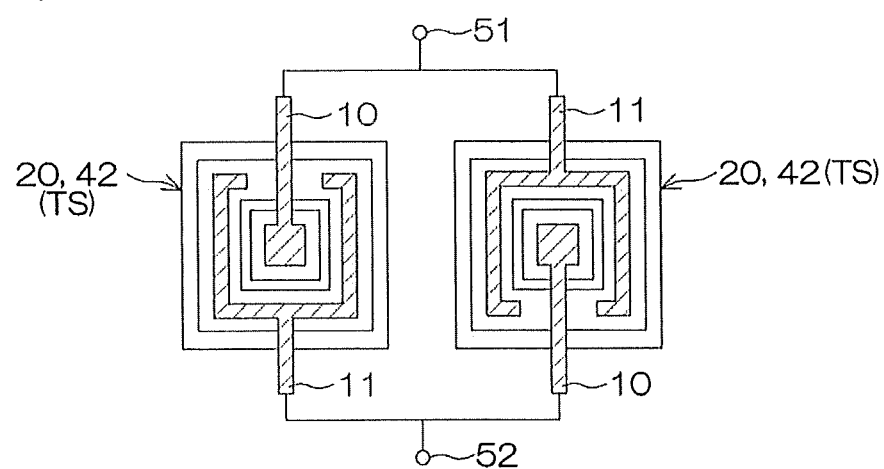
FIG. 14 (Reverse parallel connection)

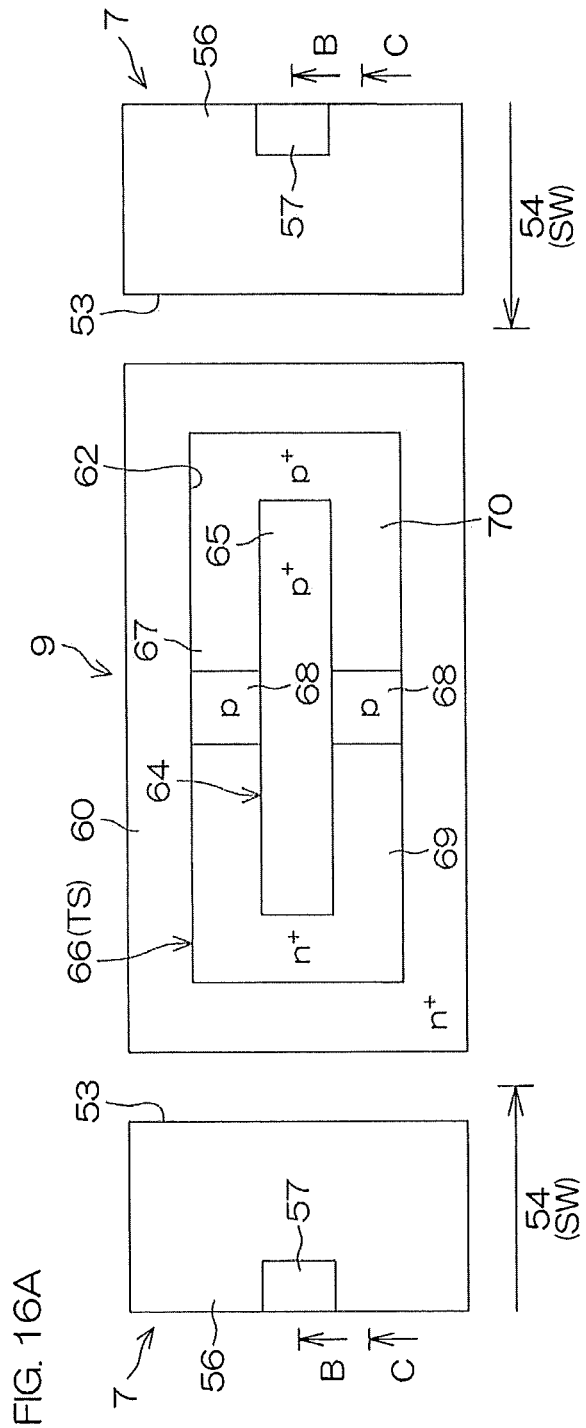

SEMICONDUCTOR DEVICE AND SEMICONDUCTOR MODULE

CROSS-REFERENCE TO RELATED APPLICATIONS

The present application corresponds to Japanese Patent Application No. 2015-26756 filed in the Japan Patent Office on Feb. 13, 2015, and the entire disclosure of the application is incorporated herein by reference.

TECHNICAL FIELD

The present invention relates to a semiconductor device and a semiconductor module provided therewith.

BACKGROUND ART

A switching device may cause thermal destruction when an overcurrent continues to flow, for example, upon short circuit. In order to prevent a malfunction of this type, for example, Patent Document 1 (Japanese Patent Application Publication No. 2013-247804) has disclosed a semiconductor device which includes a semiconductor switching element, a semiconductor driving circuit, a sense element defined in the semiconductor switching element and an overcurrent detection portion defined in the semiconductor driving circuit. The sense element is arranged with a sense terminal in which a current flows in proportion to a main current of the semiconductor switching element and a sense resistor which is connected between a main terminal of the semiconductor switching element and the sense terminal to convert a voltage of the sense current. Further, the overcurrent detection portion detects a sense current which flows through the sense element described above and turns off the semiconductor switching element when the sense current exceeds a predetermined value, thereby protecting the semiconductor switching element from the overcurrent.

SUMMARY OF INVENTION

An overcurrent protection system disclosed in Patent Document 1 is conducted by a method in which the semiconductor switching element is turned off based on a sense current. Therefore, the system is susceptible to an influence of noise and may erroneously detect a noise-contaminated sense current as an overcurrent in some cases. In order to prevent a malfunction derived from the noise, such a system is available that a semiconductor switching element is not turned off instantly when a sense current exceeds a predetermined threshold value but turned off after the lapse of a certain waiting time (mask time).

However, the above-described system which provides the waiting time also has a problem. A certain waiting time is needed, with the influence of noise taken into account (for example, about 500n seconds). While a device which has low on-resistance is under development, such a case is found in which time at which the device is broken by an overcurrent is shorter than the waiting time, thus resulting in a failure of the overcurrent protection system itself.

Thus, a preferred embodiment of the present invention is to provide a semiconductor device which is capable of reducing a malfunction derived from current noise and protecting favorably a switching element from an overcurrent and also provide a semiconductor module which is provided with the semiconductor device.

BRIEF DESCRIPTION OF DRAWINGS

FIG. 5A is a schematic plan view which shows a structure of a temperature sense region in the semiconductor device of FIG. 3.

FIG. 10 is a drawing which shows one example of connection modes of the temperature sense diode.

FIG. 11 is a drawing which shows one example of connection modes of the temperature sense diode.

FIG. 12 is a drawing which shows one example of connection modes of the temperature sense diode.

FIG. 13 is a drawing which shows one example of connection modes of the temperature sense diode.

FIG. 14 is a drawing which shows one example of connection modes of the temperature sense diode.

FIG. 16A is a schematic plan view which shows a structure of the temperature sense region in the semiconductor device of FIG. 3.

DESCRIPTION OF EMBODIMENTS

Figure 1:
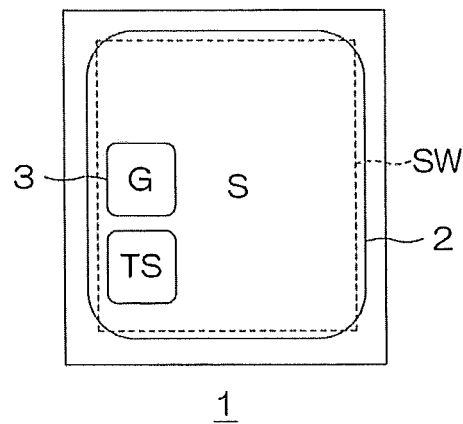
FIG. 1 is a schematic outline drawing of a semiconductor device according to a preferred embodiment of the present invention.

A preferred embodiment of the present invention provides a semiconductor device which includes a semiconductor substrate, a switching element defined on the semiconductor substrate and a temperature sense element which is provided on the surface of the semiconductor substrate independently from the switching element and characterized by being dependent on a temperature.

Further, a preferred embodiment of the present invention provides a semiconductor device which includes a semiconductor substrate, a switching element defined on the semiconductor substrate and a temperature sense element which is provided on the surface of the semiconductor substrate independently from the switching element and characterized by being dependent on a temperature and provides the semiconductor device which performs a single function by the switching element.

According to the above arrangement, when a temperature changes on the surface of the semiconductor substrate, the temperature sense element will thereby be changed in characteristics (voltage value, resistance value, and the like). Therefore, the change in characteristics of the temperature sense element can be monitored to detect a change in temperature of the semiconductor substrate. For example, when an overcurrent flows in the switching element due to a short circuit or the like, the above relationship is used to detect a temperature rise of the semiconductor substrate due to the overcurrent. It is thereby possible to determine whether or not the overcurrent flows in the switching element on the basis of the detection result. Further, a target to be monitored is not a sense current which flows in the switching element. Therefore, even where noise enters into the sense current to cause superimposition, there is no chance that a current resulting from the superimposition is erroneously detected as an overcurrent. As a result, it is possible to reduce a malfunction by current noise.

A preferred embodiment of the present invention includes mutually paired first and second electrodes on the semiconductor substrate in which only the temperature sense element is provided as a circuit element in an electrical circuit between the first electrode and the second electrode.

In a preferred embodiment of the present invention, the temperature sense element includes a pn diode which is made of a polysilicon layer defined on the semiconductor substrate.

Polysilicon can be easily defined into a desired shape and at a desired position by semiconductor manufacturing technology which has been established. Therefore, the polysilicon layer (pn diode) is defined in the vicinity of the surface of the semiconductor substrate which is a heat generating portion, thus making it possible to detect a change in temperature of the semiconductor substrate with high accuracy. For example, a constant current is continuously applied to the pn diode to monitor a forward direction voltage $V_F$ of the pn diode, thus making it possible to detect a change in temperature of the semiconductor substrate.

In a preferred embodiment of the present invention, the switching element includes a planar gate type MISFET having a gate electrode which is defined along the surface of the semiconductor substrate, and the polysilicon layer is defined on the same layer as that of the gate electrode.

According to this arrangement, the polysilicon layer (pn diode) can be defined in the same step as that of the gate electrode, by which it is possible to suppress an increase in the number of steps in defining the pn diode. Further, the pn diode can be disposed on the semiconductor substrate via a gate insulating film which is thinner than a relatively thick film such as an interlayer insulating film, by which a position of the pn diode can be brought immediately near a current channel on the surface of the semiconductor substrate. It is thereby possible to detect a change in temperature of the semiconductor substrate with improved accuracy.

In a preferred embodiment of the present invention, the pn diode includes a p-type region and an n-type region which surrounds the p-type region in a plan view.

According to this arrangement, since the p-type region is not overlapped with the n-type region in a plan view, the need for separately providing routing wiring or the like is eliminated. Therefore, contact can be provided easily both in the p-type region and the n-type region.

In a preferred embodiment of the present invention, the switching element includes a trench gate type MISFET which has a gate trench defined on the semiconductor substrate and a gate electrode buried into the gate trench, and the polysilicon layer is buried into a second trench defined on the semiconductor substrate independently from the gate trench.

According to this arrangement, the second trench can be defined in the same step as that of the gate trench, and the polysilicon layer (pn diode) can be defined in the same step as that of the gate electrode, thus making it possible to suppress an increase in the number of steps in defining the pn diode. Further, the pn diode is arranged so as to be buried into a surface portion of the semiconductor substrate, by which a position of the pn diode can be brought immediately near a current channel on the surface of the semiconductor substrate. It is thereby possible to detect a change in temperature of the semiconductor substrate with improved accuracy.

In a preferred embodiment of the present invention, the gate trench and the second trench are defined so as to be equal in width to each other.

According to this arrangement, since the gate trench and the second trench can be defined at substantially the same etching rate, it is possible to finally define the gate trench and the second trench at substantially the same depth. The second trench is made substantially equal in depth to the gate trench where a channel of the MISFET is defined, thus making it possible to promptly detect a temperature rise of the semiconductor substrate resulting from an overcurrent.

In a preferred embodiment of the present invention, the temperature sense element includes a pn diode which is made of an impurity region defined on the surface portion of the semiconductor substrate.

The impurity region can be easily defined at a desired position by semiconductor manufacturing technology which has been established. Therefore, the impurity region (pn diode) is defined so as to be immediately near a current channel on the surface of the semiconductor substrate which is a heat generating portion, thus making it possible to detect a change in temperature of the semiconductor substrate with high accuracy. For example, a constant current is continuously applied to a pn diode to monitor a forward direction voltage $V_F$ of the pn diode, thus making it possible to detect a change in temperature of the semiconductor substrate. Further, where the pn diode is made of an impurity region, the pn diode can be favorably operated at a high temperature region (for example, 200° C. or higher). Thus, the pn diode is in particular effectively used in a power device such as SiC and GaN.

In a preferred embodiment of the present invention, the above-described pn diode includes a p-type region and an n-type region which surrounds the p-type region in a plan view.

According to this arrangement, since the p-type region is not overlapped with the n-type region in a plan view, the need for separately providing routing wiring or the like is eliminated. Therefore, contact can be provided easily both in the p-type region and the n-type region.

In a preferred embodiment of the present invention, the temperature sense element includes a serial connection unit in which the plurality of pn diodes are connected in series.

According to this arrangement, a variation in temperature of the forward direction voltage $V_F$ is increased in proportion to the number of the connected pn diodes, thus making it possible to detect a change in temperature with an improved sensitivity. When deflection width of the forward direction voltage $V_F$ per pn diode is, for example, XmV/° C., five of the pn diodes are connected in series to arrange a serial connection unit, by which the deflection width of the serial connection unit as a whole can be made into 5 XmV/° C.

In a preferred embodiment of the present invention, the temperature sense element includes an arrangement in which at least a pair of serial connection units are connected in parallel in a reverse direction to each other.

According to this arrangement, a terminal of an aggregate of the pn diodes is free of distinction of polarity between an anode side and a cathode side. Therefore, wiring such as bonding wires can be improved in degree of freedom on assembly of a module or the like.

In a preferred embodiment of the present invention, the temperature sense element includes a reverse-series connection unit in which at least a pair of pn diodes are connected in series in a reverse direction to each other.

According to this arrangement, of the pair of pn diodes, since a reverse bias is applied to at least one of them, the reverse-series connection unit as a whole is increased in resistance. Therefore, it is possible to suppress a current necessary for monitoring a change in temperature to a lower extent and attain power saving.

In a preferred embodiment of the present invention, the temperature sense element includes an arrangement in which the plurality of reverse-series connection units are connected in series.

According to this arrangement, it is possible to attain power saving to a greater extent.

In a preferred embodiment of the present invention, the temperature sense element includes an arrangement in which at least a pair of pn diodes are connected in parallel in a reverse direction to each other.

According to this arrangement, terminals of the pair of pn diodes are free of distinction of polarity between an anode side and a cathode side, therefore, wiring such as bonding wires can be improved in degree of freedom on assembly of a module, etc.

In a preferred embodiment of the present invention, the temperature sense element is disposed at a peripheral portion of the semiconductor substrate.

According to this arrangement, a relatively wide region can be secured at a part other than a region where the temperature sense element is placed, thus making it possible to increase an area of a terminal for a switching element. Therefore, even when a chip is downsized, wiring members such as a bonding plate and relatively thick bonding wires can be connected to the terminal.

In a preferred embodiment of the present invention, the semiconductor substrate includes a SiC semiconductor substrate.

According to this arrangement, it is possible to favorably protect a low on-resistance SiC switching element from an overcurrent.

A preferred embodiment of the present invention provides a semiconductor module which includes the above-described semiconductor device and a second semiconductor device which has a circuit that is electrically connected to the switching element and the temperature sense element, that is, a circuit which cuts off a current channel of the switching element when a determination is made that an overcurrent flows in the switching element on the basis of a change in characteristics of the temperature sense element.

According to this arrangement, since the above-described semiconductor devices are provided, it is possible to realize a semiconductor module which is reduced in malfunction due to current noise and also favorably protects the switching element from the overcurrent.

Hereinafter, a detailed description will be given of the preferred embodiments of the present invention by referring to attached drawings.

FIG. 1 is a schematic outline drawing which shows a semiconductor device 1 according to a preferred embodiment of the present invention.

The semiconductor device 1 is a discrete semiconductor device and provided with a single function by a switching element SW. The switching element SW may be, for example, a MISFET (metal insulator semiconductor field effect transistor) or may be others such as an IGBT (insulated gate bipolar transistor), a JFET (junction field effect transistor), a bipolar transistor and a thyristor. In this preferred embodiment, a case where the switching element SW is a MISFET is shown. A source pad 2 and a gate pad 3 are defined on the surface of the semiconductor device 1 which is defined as a tetragonal chip in a plan view. The source pad 2 covers substantially all the surface and the gate pad 3 is disposed in an internal region of the source pad 2. Further, although not illustrated, a drain electrode is defined at the back of the semiconductor device 1.

The semiconductor device 1 is provided with a temperature sense element TS, in addition to the above-described switching element SW. The temperature sense element TS is disposed on the surface of the semiconductor device 1. The temperature sense element TS is independent from the switching element SW and not directly involved in switching operation by the switching element SW.

Figure 2:
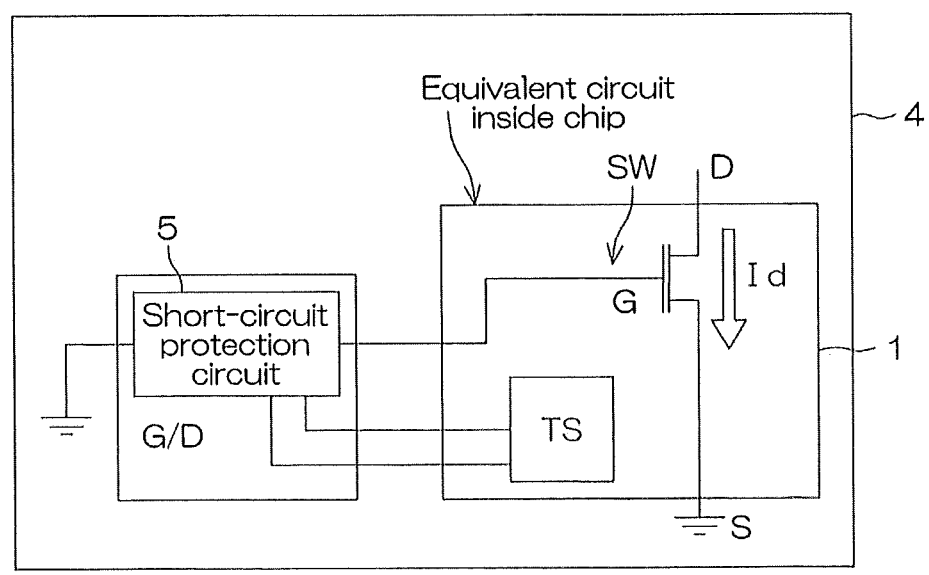
FIG. 2 is a circuit diagram of a semiconductor module which is provided with the semiconductor device shown in FIG. 1.

Next, a brief description will be given of an overcurrent protection system in a semiconductor module 4 which is provided with the semiconductor device 1. FIG. 2 is a circuit diagram of the semiconductor module 4 which is provided with the semiconductor device 1 of FIG. 1.

The semiconductor module 4 includes the semiconductor device 1 and a gate driver G/D as an example of the second semiconductor device of the present invention which has a short-circuit protection circuit 5. The semiconductor module 4 may be provided with semiconductor chips (IC, discrete component, etc.) other than those shown in FIG. 2.

The short-circuit protection circuit 5 is electrically connected to a gate G of the switching element SW and to the temperature sense element TS individually in an independent manner. The short-circuit protection circuit 5 continuously monitors characteristics of the temperature sense element TS. For example, when a short circuit occurs in the switching element SW and an overcurrent flows, the temperature sense element TS undergoes a change in characteristics by heat generation resulting from the overcurrent. The short-circuit protection circuit 5 senses the change in characteristics as occurrence of a short circuit in the switching element SW and turns off the gate G of the switching element SW. Thereby, a drain current Id which flows between a source and a drain (S-D) of the switching element SW is cut off to protect the switching element SW.

Figure 3:
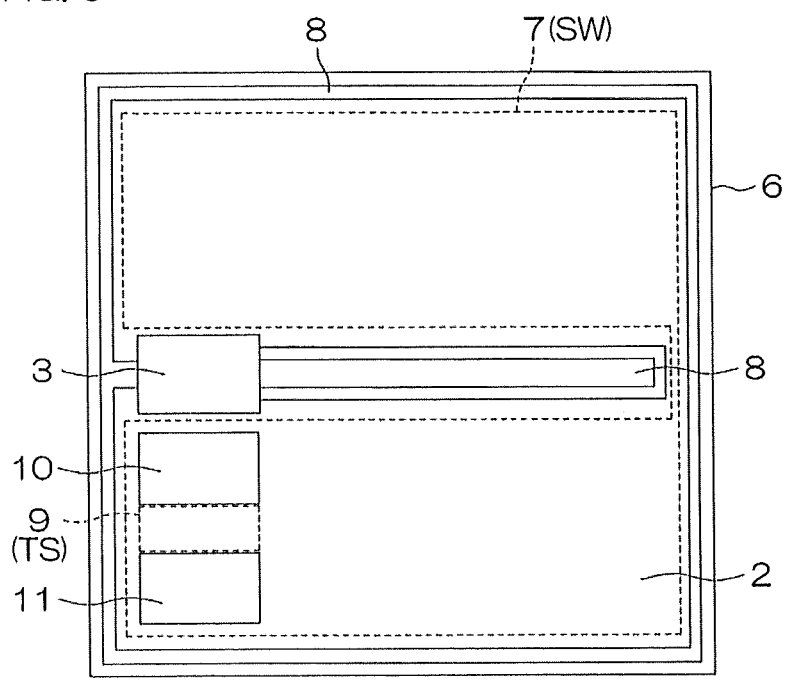
FIG. 3 is a drawing which shows a plane structure of the semiconductor device of FIG. 1 more specifically.

FIG. 3 is a drawing which shows a plane structure of the semiconductor device 1 of FIG. 1 more specifically.

The semiconductor device 1 includes a semiconductor substrate 6 which defines an outer configuration thereof and has a structure in which the switching element SW and the temperature sense element TS are defined on the semiconductor substrate 6.

The semiconductor substrate 6 is formed in a tetragonal shape in a plan view, and a substantially entire region of the surface thereof is covered by the source pad 2 which is formed substantially in a tetragonal shape in a plan view. A cell region 7 which constitutes the switching element SW is defined at a greater part below the source pad 2. The gate pad 3 is disposed at least at one side of an outer peripheral side of the semiconductor substrate 6. A gate finger 8 is connected to the gate pad 3. The gate finger 8 extends to a central portion of the semiconductor substrate 6 to separate the cell region 7 into one side and the other side and also extends to a peripheral portion of the semiconductor substrate 6, thereby surrounding the cell region 7.

A temperature sense region 9 which constitutes the temperature sense element TS is defined in an internal region of the cell region 7. The temperature sense region 9 is surrounded by the cell region 7. A position of the temperature sense region 9 may be, for example, at a peripheral portion of the semiconductor substrate 6. As long as the temperature sense region 9 is disposed at a peripheral portion of the semiconductor substrate 6, a relatively wide region can be secured at a part other than the temperature sense region 9 on the semiconductor substrate 6. Therefore, the source pad 2 can be increased in area. As a result, even if a chip is downsized, wiring members such as a bonding plate and relatively thick bonding wires can be connected to the source pad 2.

A first electrode 10 and a second electrode 11 are provided so as to hold the temperature sense region 9 between them in a plan view. That is, the paired first electrode 10 and second electrode 11 are disposed on the semiconductor substrate 6, at an interval kept between them, and the temperature sense region 9 is defined in a region between the first electrode 10 and the second electrode 11. The first electrode 10 and the second electrode 11 are disposed side by side, for example, along one side of the semiconductor substrate 6 in which the gate pad 3 is disposed. Thereby, wiring members such as bonding wires can be drawn out in the same direction (in the left direction of the plane of FIG. 3) individually from the gate pad 3, the first electrode 10 and the second electrode 11. Further, the first electrode 10, the second electrode 11, the source pad 2, the gate pad 3 and the gate finger 8 are made of an electrode film of the same material. They can be defined at the same time, for example, by subjecting the electrode film to patterning after the electrode film has been defined on the semiconductor substrate 6.

<Cell Structure>

Figure 4A:
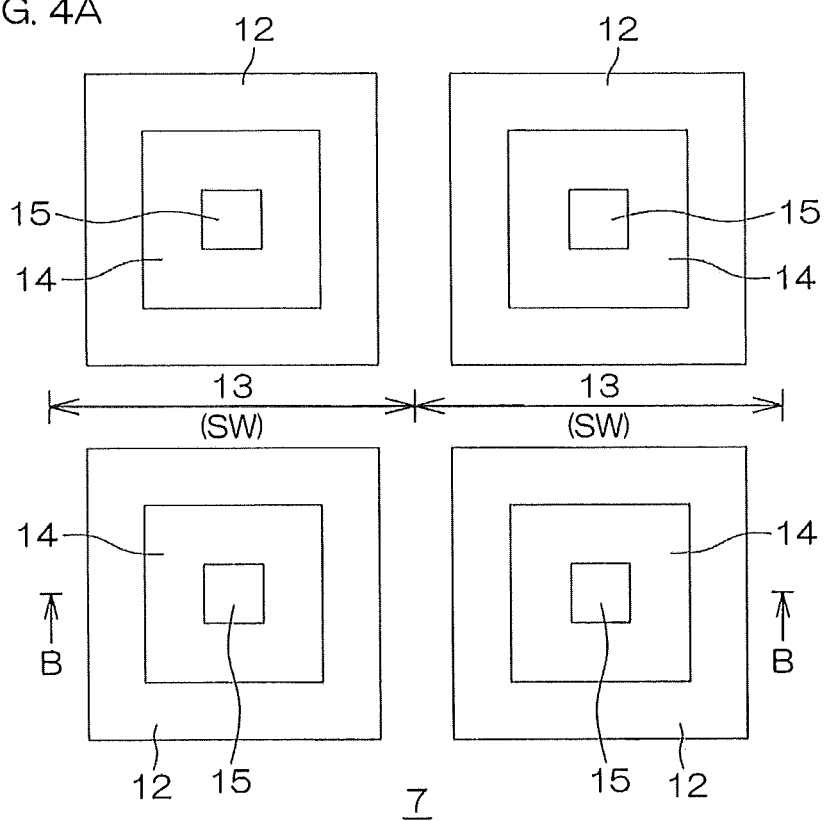
FIG. 4A is a schematic plan view which shows a structure of a cell region in the semiconductor device of FIG. 3.
Figure 4B:
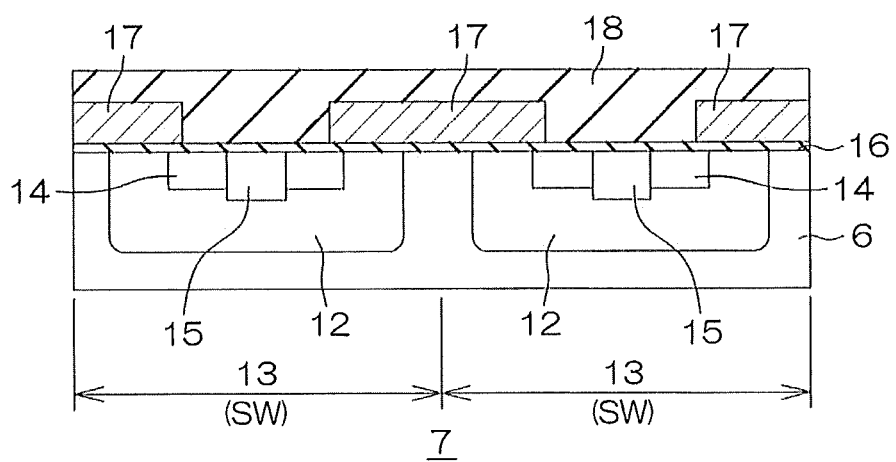
FIG. 4B is a sectional view of FIG. 4A (a sectional view taken along line B-B).

FIG. 4A is a schematic plan view which shows a structure (planar gate structure) of the cell region 7 in the semiconductor device 1 of FIG. 3. FIG. 4B is a sectional view (a sectional view taken along line B-B) of FIG. 4A.

The semiconductor substrate 6 may be, for example, a SiC substrate and may also be others such as a GaN substrate and a Si substrate. Further, the semiconductor substrate 6 may be an epitaxial substrate which includes a ground substrate and an epitaxial layer, the crystal of which has grown thereon. In this preferred embodiment, a case where the semiconductor substrate 6 is an n-type SiC epitaxial substrate is shown. The n-type SiC epitaxial substrate may include an n$^+$-type ground substrate and an n$^-$-type epitaxial layer on the n$^+$-type ground substrate. The n$^+$-type ground substrate may be, for example, from $1.0 \times 10^{18}$ cm$^{-3}$ to $1.0 \times 10^{20}$ cm$^{-3}$ in impurity concentration. The n$^-$-type epitaxial layer may be, for example, from $5.0 \times 10^{14}$ cm$^{-3}$ to $5.0 \times 10^{16}$ cm$^{-3}$ in impurity concentration. As n-type impurities, for example, N (nitrogen), As (arsenic) and P (phosphorus), etc., can be cited.

As shown in FIG. 4A and FIG. 4B, a plurality of p-type body regions 12 are defined on a surface portion of the semiconductor substrate 6 in the cell region 7. The plurality of p-type body regions 12 may be defined, for example, in a matrix form (in a row and column form) in a plan view, as shown in FIG. 4A and may also be defined in other forms such as a stripe form or a honeycomb form. A line for demarcating each unit cell 13 of the switching element SW is provided between mutually adjacent p-type body regions 12. The p-type body region 12 may be, for example, from $1 \times 10^{15}$ cm$^{-3}$ to $1 \times 10^{20}$ cm$^{-3}$ in p-type impurity concentration. As p-type impurities, for example, B (boron) and Al (aluminum), etc., can be cited.

On a surface portion of the internal region in the p-type body region 12, an n$^+$-type source region 14 is defined, at an interval apart from a periphery of the p-type body region 12. The n$^+$-type source region 14 is higher in n-type impurity concentration than the n-type semiconductor substrate 6 and may be, for example, from $1 \times 10^{18}$ cm$^{-3}$ to $5 \times 10^{21}$ cm$^{-3}$.

A p$^+$-type body contact region 15 is defined in an internal region of the n$^+$-type source region 14. The p$^+$-type body contact region 15 is defined so as to penetrate through the n$^+$-type source region 14 in a depth direction. The p$^+$-type body contact region 15 is higher in p-type impurity concentration than the p-type body region 12 and may be, for example, from $1 \times 10^{18}$ cm$^{-3}$ to $5 \times 10^{21}$ cm$^{-3}$.

A gate insulating film 16 is defined on the surface of the semiconductor substrate 6. The gate insulating film 16 may be made of silicon oxide (SiO$_2$), for example. The thickness of the gate insulating film 16 may be, for example, from 300 Å to 600 Å.

A gate electrode 17 is defined on the gate insulating film 16. The gate electrode 17 opposes a peripheral portion of the p-type body region 12 (a part which surrounds the n$^+$-type source region 14 in a plan view), with the gate insulating film 16 held therebetween. Although the gate electrode 17 is made of, for example, n-type polysilicon (n-type doped polysilicon), it may be made of p-type polysilicon. The thickness of the gate electrode 17 may be, for example, from 6000 Å to 12000 Å.

An interlayer insulating film 18 which covers the gate electrode 17 is defined on an entire surface of the semiconductor substrate 6. The interlayer insulating film 18 may be made of, for example, silicon oxide (SiO$_2$) or may be arranged so as to be laminated with a plurality of silicon oxide films, as will be described later (refer to FIG. 7I to FIG. 7L). The thickness of the interlayer insulating film 18 (entire thickness in the case of a plurality of films) may be, for example, from 1000 Å to 2000 Å. Although not illustrated, wiring which electrically connects the source pad 2 with the n$^+$-type source region 14 and the p$^+$-type body contact region 15 and wiring which electrically connects the gate pad 3 with the gate electrode 17 are each defined on the interlayer insulating film 18 so as to penetrate therethrough.

<Structure of Temperature Sense Element>

Figure 5B:
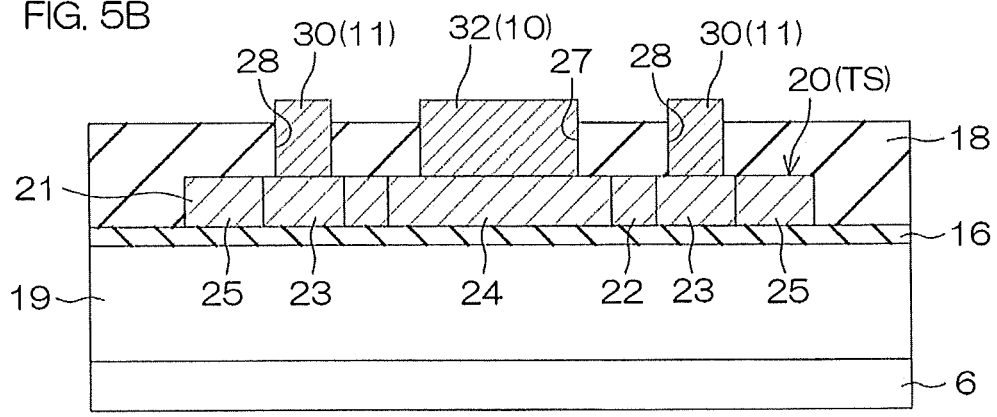
FIG. 5B is a sectional view of FIG. 5A (a sectional view taken along line B-B).
Figure 5C:
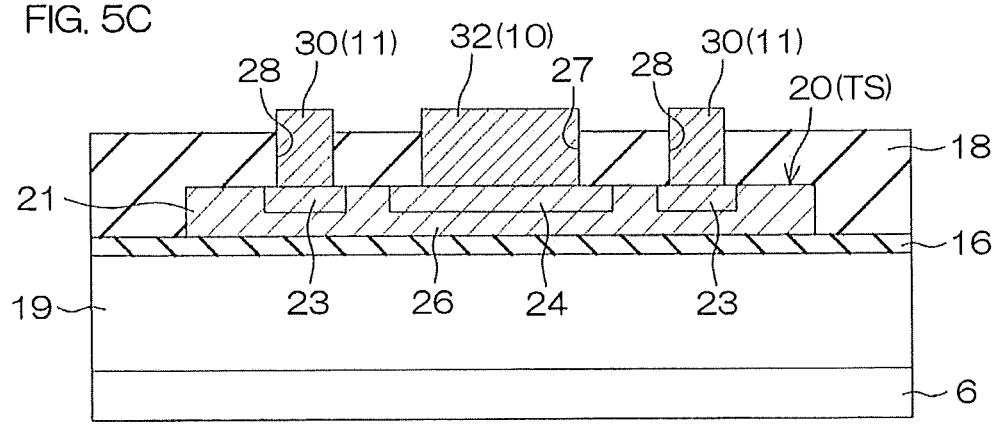
FIG. 5C is a drawing which shows a modified example of the structure shown in FIG. 5B.

FIG. 5A is a schematic plan view which shows a structure of the temperature sense region 9 in the semiconductor device 1 of FIG. 3. FIG. 5B is a sectional view of FIG. 5A (a sectional view taken along line B-B). FIG. 5C is a drawing which shows a modified example of the structure of FIG. 5B.

As shown in FIG. 5B, a p-type region 19 is defined on a surface portion of the semiconductor substrate 6 in the temperature sense region 9. The p-type region 19 may be a conductive impurity region which is the same as the p-type body region 12 and may also be equal to the p-type body region 12 in p-type impurity concentration and depth.

The gate insulating film 16 of the cell region 7 is defined on the surface of the semiconductor substrate 6 so as to extend up to the temperature sense region 9. A temperature sense diode 20 (pn diode) as one example of the temperature sense element TS is defined on the gate insulating film 16 in the temperature sense region 9. The temperature sense diode 20 is opposed to the semiconductor substrate 6, with the gate insulating film 16 held therebetween. For example, as shown in FIG. 5B, the temperature sense diode 20 in its entirety may be opposed to a single impurity region of the semiconductor substrate 6 (in this preferred embodiment, the p-type region 19).

The temperature sense diode 20 is made of, for example, a single-layered polysilicon layer 21. The temperature sense diode 20 made of the polysilicon layer 21 may be defined in the same step as that of the gate electrode 17 and, thereby, defined on the same layer as that of the gate electrode 17. That is, the polysilicon layer 21 may be defined in the thickness of 6000 Å to 12000 Å as with the gate electrode 17. As a matter of course, the polysilicon layer 21 may be defined in a step different from that of the gate electrode 17 or may have the thickness different from that of the gate electrode 17.

The temperature sense diode 20 includes a p-type region 22 and an n$^+$-type region 23 which surrounds the p-type region 22. As long as such an arrangement is realized that the p-type region 22 is surrounded by the n$^+$-type region 23, the p-type region 22 is not overlapped with the n$^+$-type region 23 in a plan view. Thus, the need for separately providing routing wiring or the like is eliminated, and contact can be provided easily both in the p-type region 22 and the n$^+$-type region 23.

Each of the p-type region 22 and the n$^+$-type region 23 may be defined so as to extend from the surface of the polysilicon layer 21 to the back thereof, as shown in FIG. 5B, or may be selectively defined on the surface portion of the polysilicon layer 21, although not illustrated. In addition, the p-type region 22 may not be surrounded by the n$^+$-type region 23 and, for example, the p-type region 22 and the n$^+$-type region 23 may be defined so as to be adjacent to each other, thereby partially having a periphery which is not common. Further, the p-type region 22 may be, for example, from $1\times10^{18}$ cm$^{-3}$ to $1\times10^{20}$ cm$^{-3}$ (equal to the p-type body region 12) in p-type impurity concentration. The n$^+$-type region 23 may be, for example, from $1\times10^{18}$ cm$^{-3}$ to $5\times10^{21}$ cm$^{-3}$ (equal to the n$^+$-type source region 14) in n-type impurity concentration.

The temperature sense diode 20 may additionally include a p$^+$-type contact region 24 and a p-type outer periphery region 25. The p$^+$-type contact region 24 may be defined in an internal region of the p-type region 22, at an interval apart from a periphery of the p-type region 22, and the p-type outer periphery region 25 may be defined so as to surround the n$^+$-type region 23. The p$^+$-type contact region 24 and the p-type outer periphery region 25 may each be defined so as to extend from the surface of the polysilicon layer 21 to the back thereof, as shown in FIG. 5B, or may be selectively defined on the surface portion of the polysilicon layer 21, although not illustrated. Further, the p$^+$-type contact region 24 may be, for example, from $1\times10^{18}$ cm$^{-3}$ to $5\times10^{21}$ cm$^{-3}$ (equal to the p$^+$-type body contact region 15) in p-type impurity concentration. The p-type outer periphery region 25 may be, for example, from $1\times10^{15}$ cm$^{-3}$ to $1\times10^{20}$ cm$^{-3}$ (equal to the p-type body region 12) in p-type impurity concentration.

In addition, the temperature sense diode 20 may be arranged, as shown in FIG. 5C, so as to have a p-type base layer 26 which is made of conductive p-type polysilicon (p-type doped polysilicon) reverse to the gate electrode 17 as well as the n$^+$-type region 23 and the p$^+$-type contact region 24 selectively defined on the surface portion of the p-type base layer 26.

The temperature sense diode 20 is covered with the interlayer insulating film 18 on the semiconductor substrate 6. The first electrode 10 is connected via a contact hole 27 of the interlayer insulating film 18 to the p$^+$-type contact region 24 as an anode electrode. The second electrode 11 is connected via a contact hole 28 of the interlayer insulating film 18 to the n$^+$-type region 23 as a cathode electrode. As described previously, the first electrode 10 and the second electrode 11 connected to both ends of the temperature sense diode 20 are defined so as to be separated from the source pad 2 and the gate pad 3 for the switching element SW. Therefore, the temperature sense diode 20 is electrically independent from the switching element SW.

Polysilicon can be easily defined into a desired shape or at a desired position by semiconductor manufacturing technology which has been established. Therefore, the temperature sense diode 20 is defined in the vicinity of the switching element SW or near the surface of the semiconductor substrate 6 which is a heat generating portion, thus making it possible to detect a change in temperature of the semiconductor substrate 6, with high accuracy. For example, a constant current is applied to the temperature sense diode 20 to monitor a forward direction voltage $V_F$ of the temperature sense diode 20, thereby making it possible to detect a change in temperature of the semiconductor substrate 6. For example, a constant current of 1 µA may be applied to monitor the forward direction voltage $V_F$. An electric current may be a constant current in a range of 1 µA to 100 µA.

The second electrode 11 integrally includes an annular contact portion 30 having an open portion 29 at a part thereof and a line-shaped drawing portion 31 extending from the contact portion 30 on the interlayer insulating film 18. The contact portion 30 surrounds the p-type region 22 in a plan view. Further, the contact hole 28 is defined annularly so as to be opened partially along the contact portion 30.

The first electrode 10 integrally includes a contact portion 32 which is surrounded by the contact portion 30 of the second electrode 11 and a line-shaped drawing portion 33 which extends from the contact portion 32 through the open portion 29 on the interlayer insulating film 18. The contact portion 32 is disposed on the p$^+$-type contact region 24. Further, the contact hole 27 is defined so as to overlap with the lower portion of the contact portion 32.

Figure 6:
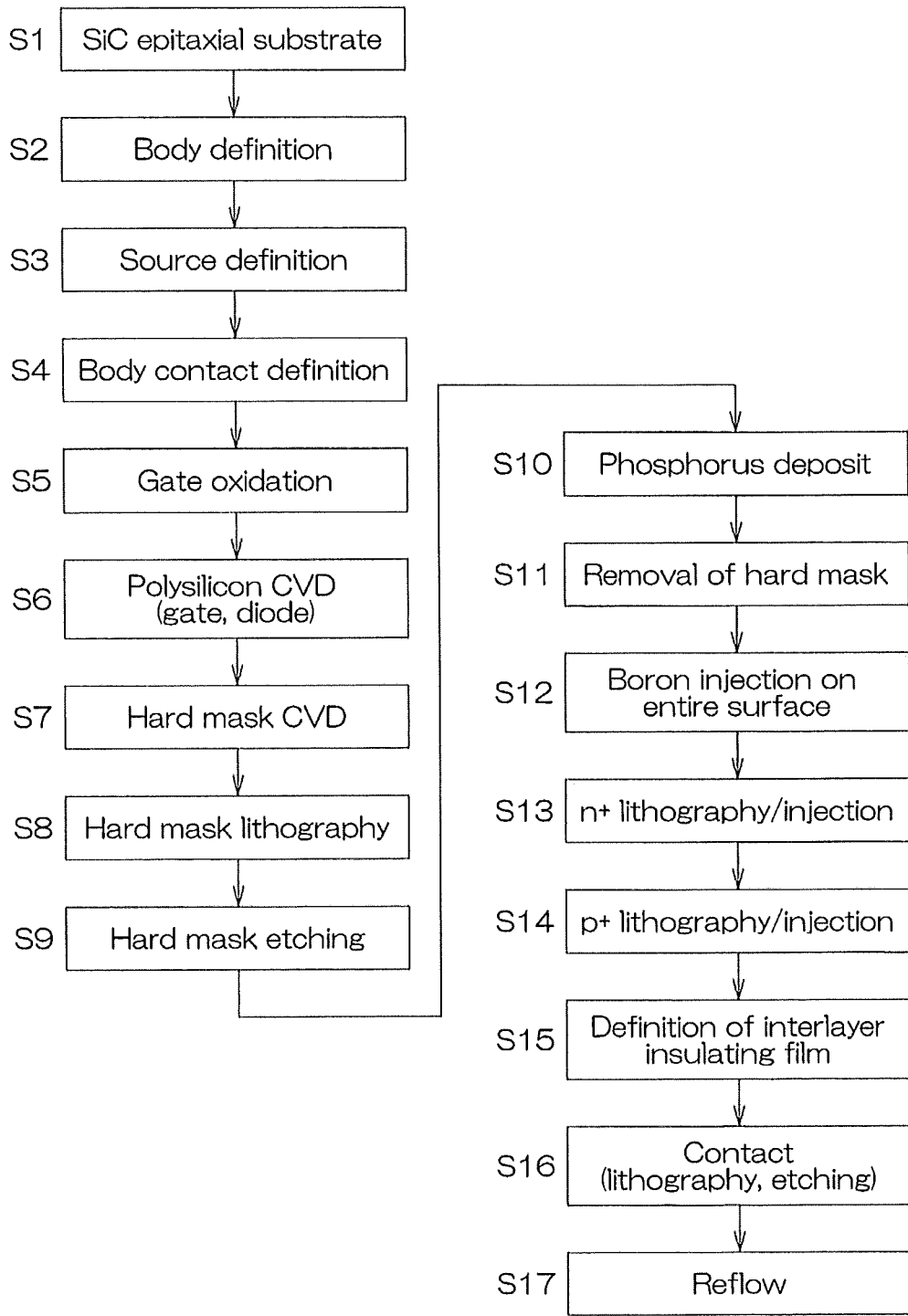
FIG. 6 is a flow chart which shows production steps of the semiconductor device.

Next, a description will be given of a method for producing the semiconductor device 1. FIG. 6 is a flow chart which shows production steps of the semiconductor device 1. Drawings of FIG. 7A to FIG. 7L show some of the production steps of the semiconductor device 1 according to a process thereof. In addition, FIG. 7A to FIG. 7L do not individually correspond to each of the steps shown in FIG. 6. Hereinafter, the production steps of the semiconductor device 1 will be described according to the flow shown in FIG. 6, and FIG. 7A to FIG. 7L will be referred to whenever necessary.

In producing the semiconductor device 1, for example, an n$^-$-type epitaxial layer is defined on the n$^+$-type ground substrate by epitaxial growth (Step 1). Thereby, the semiconductor substrate 6 is defined.

Next, p-type impurities are selectively injected into the semiconductor substrate 6 to define the p-type body region 12 and the p-type region 19 (Step S2). In a similar manner, n-type impurities and p-type impurities are selectively injected into the semiconductor substrate 6 to define the $n^+$-type source region 14 and the $p^+$-type body contact region 15 (Steps S3, S4).

Figure 7A:
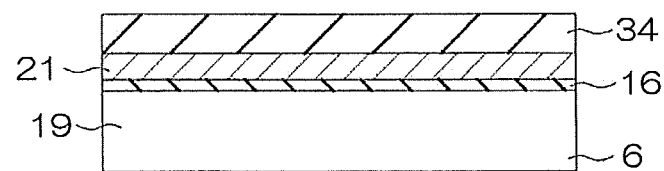
FIG. 7A to FIG. 7L are drawings, each of which shows some of the production steps of the semiconductor device.

Next, as shown in FIG. 7A, the semiconductor substrate 6 is thermally oxidized to define the gate insulating film 16 on the surface of the semiconductor substrate 6 (Step S5). Next, the polysilicon layer 21 which is a base of the gate electrode 17 and that of the temperature sense diode 20 is defined, for example, by a CVD method (Step S6). Subsequently, a hard mask 34 made of silicon oxide ($SiO_2$) (the thickness is about 900Å, for example) is defined, for example, by a CVD method (Step S7).

Figure 7B:
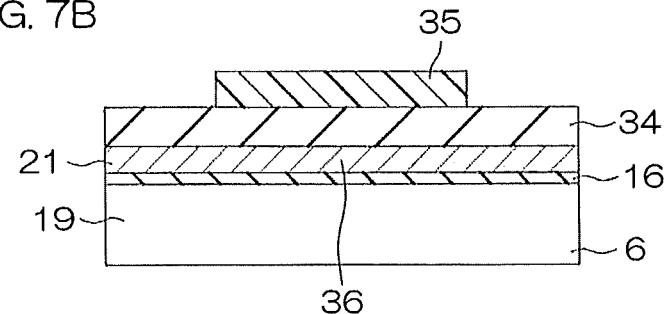

Next, as shown in FIG. 7B, a resist film 35 for lithography of the hard mask 34 is defined (Step S8). The resist film 35 is defined so as to cover the hard mask 34 in a region 36 which is to define the p-type region 22 and the $n^+$-type region 23.

Figure 7C:
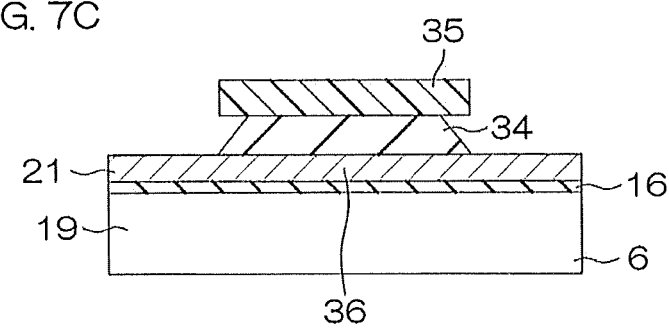

Next, as shown in FIG. 7C, the hard mask 34 is selectively subjected to etching via the resist film 35 (Step S9). Etching may be performed, for example, by wet etching by use of hydrofluoric acid. After etching, the resist film 35 is removed.

Figure 7D:
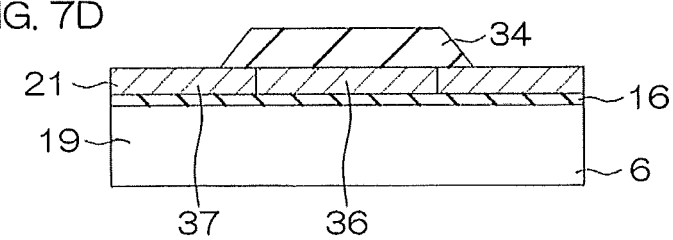

Next, as shown in FIG. 7D, an n-type impurity (for example, phosphorus) is deposited in a region 37 which is exposed from the hard mask 34 of the polysilicon layer 21 (a region other than the region 36 of the polysilicon layer 21) and diffused, for example, at about 1000° C., thereby introducing the n-type impurity into the region 37 (Step S10). Thereby, the region 37 which includes a part of the gate electrode 17 of the polysilicon layer 21 is given as n-type polysilicon, while the region 36 is kept in a non-doped state.

Figure 7E:
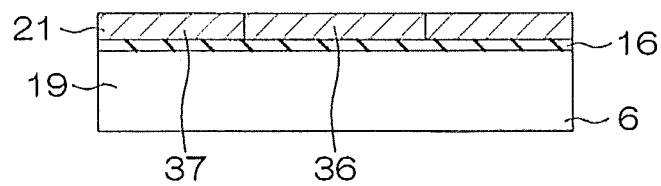

Next, as shown in FIG. 7E, the hard mask 34 which remains on the polysilicon layer 21 is removed by etching (Step S11). Etching may be performed, for example, by wet etching by use of hydrofluoric acid.

Figure 7F:
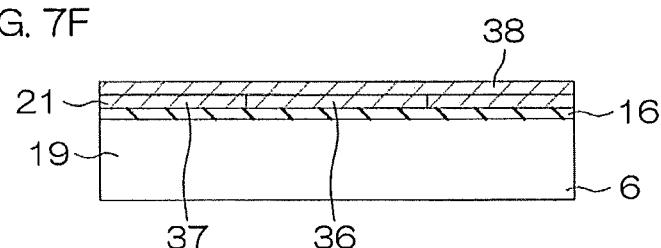

Next, as shown in FIG. 7F, in a state that a part of the gate electrode 17 of the polysilicon layer 21 is selectively covered with a mask (not illustrated), boron which is a p-type impurity is injected on an entire surface of the polysilicon layer 21 (Step S12). Thereby, a region covering from the surface of the polysilicon layer 21 to the middle of the thickness direction is given as a p-type region 38.

Figure 7G:
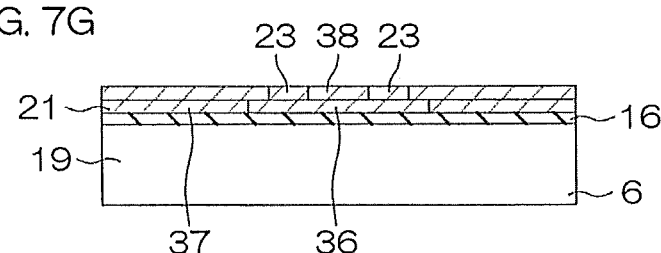

Next, as shown in FIG. 7G, a mask which selectively exposes a region at which the $n^+$-type region 23 of the polysilicon layer 21 is to be defined (not illustrated) is defined by lithography. Thereafter, the n-type impurity is injected into the region 36 via the mask (Step S13). Thereby, the $n^+$-type region 23 is defined. At this time, it suffices that the $n^+$-type region 23 may be defined only from the surface of the polysilicon layer 21 to the middle of the thickness direction as shown in FIG. 7G.

Figure 7H:
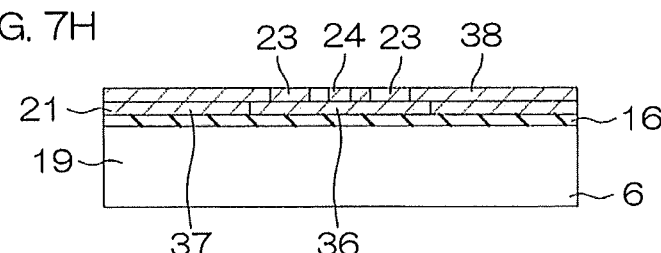

Next, as shown in FIG. 7H, a mask (not illustrated) which selectively exposes a region at which the $p^+$-type contact region 24 of the polysilicon layer 21 is to be defined is defined by lithography. Thereafter, the p-type impurity is injected via the mask into the region 36 (Step S14). Thereby, the $p^+$-type contact region 24 is defined. At this time, it suffices that the $p^+$-type contact region 24 may be defined only from the surface of the polysilicon layer 21 to the middle of the thickness direction as shown in FIG. 7H.

Figure 7I:
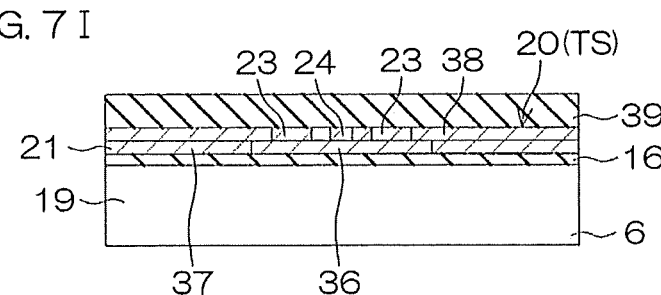

Next, as shown in FIG. 7I, a hard mask 39 which selectively covers a region at which the temperature sense diode 20 of the polysilicon layer 21 and the gate electrode 17 thereof are to be defined, is defined. Thereafter, the polysilicon layer 21 is selectively etched via the hard mask 39. Thereby, the temperature sense diode 20 and the gate electrode 17 (not described in FIG. 7I) are defined.

Figure 7J:
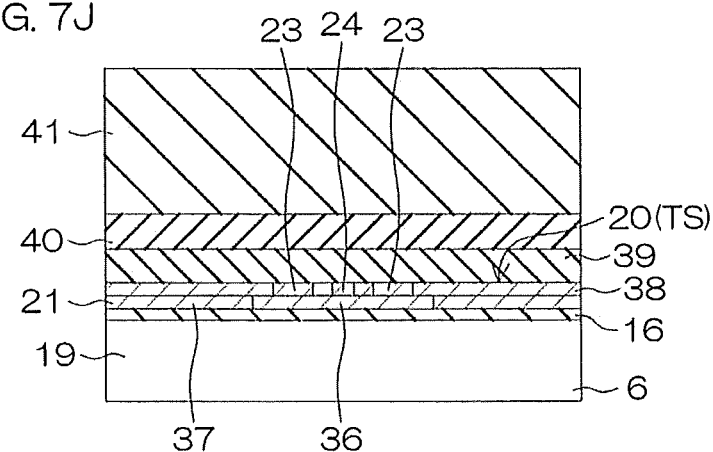

Next, as shown in FIG. 7J, in a state that the hard mask 39 is left, a plurality of insulating films are defined, for example, by a CVD method. The plurality of insulating films may include, for example, as shown in FIG. 7J, a silicon oxide film 40 on a lower side (for example, NSG (non-doped silicate glass) film) and a silicon oxide film 41 on an upper side (for example, PSG (phosphorus silicate glass) film, BPSG (boron phosphorus silicate glass) film, etc.). Thereby, an interlayer insulating film 18 which is made of the hard mask 39, the silicon oxide film 40 and the silicon oxide film 41 is defined (Step S15).

Figure 7K:
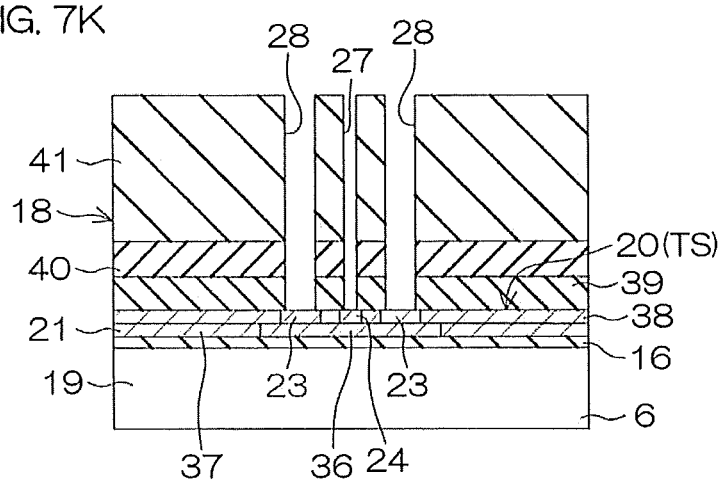

Next, as shown in FIG. 7K, the interlayer insulating film 18 is selectively etched to define the contact holes 27, 28 (Step S16).

Figure 7L:
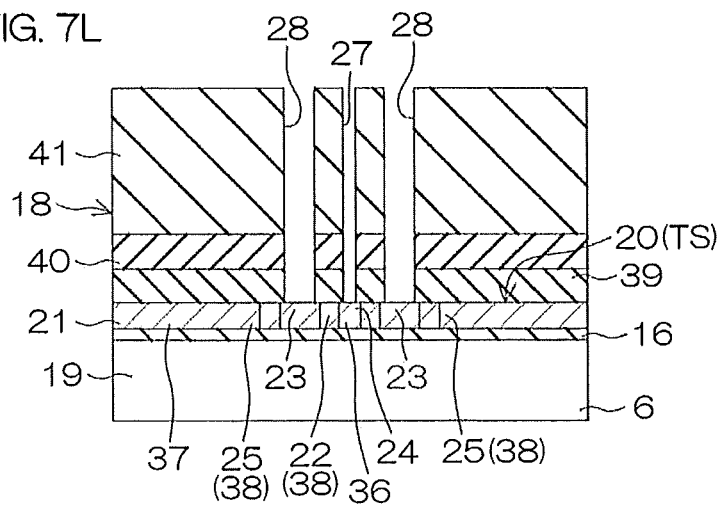

Next, as shown in FIG. 7L, the semiconductor substrate 6 is subjected to heat treatment (reflow) (Step S17). The heat treatment is performed, for example, in a nitrogen ($N_2$) atmosphere at 900° C. to 1200° C. for 5 to 15 minutes. Thereby, the p-type region 38, the $n^+$-type region 23 and the $p^+$-type contact region 24 which remain on the surface portion of the polysilicon layer 21 are diffused until reaching the back of the polysilicon layer 21.

Thereafter, various types of wiring, the source pad 2, the gate pad 3, the first electrode 10, the second electrode 11 and a passivation film, etc., are defined to provide the semiconductor device 1.

Next, a more specific description will be given of operation of the semiconductor device 1 in the semiconductor module 4 and the overcurrent protection system.

An electric circuit arrangement of the semiconductor module 4 is as shown in FIG. 2. Voltage is applied to the thus connected semiconductor device 1 by the gate driver G/D. Specifically, mainly referring to FIG. 3 and FIG. 4B, a bias voltage in which a drain electrode side is positive is imparted between the source pad 2 and a drain electrode (not illustrated). Thereby, a reverse direction voltage is imparted to a pn junction at an interface between the n-type semiconductor substrate 6 and the p-type body region 12. As a result, a cut-off state is developed between the $n^+$-type source region 14 and the semiconductor substrate 6, that is, between a source and a drain. In this state, a predetermined voltage in which the side of the gate pad 3 is positive is imparted between the source pad 2 and the gate pad 3, by which a bias to the p-type body region 12 is imparted to the gate electrode 17. Thereby, electrons are induced into a peripheral portion of the p-type body region 12 to define an inversion channel. A space between the $n^+$-type source region 14 and the semiconductor substrate 6 is conductive via the inversion channel. Thereby, a space between the source and the drain is conductive, and the drain current Id will flow.

On the other hand, with reference to FIG. 5A and FIG. 5B, a constant current is applied to the temperature sense diode 20 by the gate driver G/D. Further, the short-circuit protection circuit 5 of the gate driver G/D continuously monitors a forward direction voltage $V_F$ of the temperature sense diode 20. Normally, I-V characteristics of the temperature sense diode 20 depict, for example, a curve indicated by the solid line in FIG. 8.

Then, when a short circuit occurs in the switching element SW (MISFET) of FIG. 4A and FIG. 4B and an overcurrent flows, a temperature will rise on the surface of the semiconductor substrate 6. The temperature rise is also transmitted to the temperature sense region 9 (refer to FIG. 5B) which is defined on the semiconductor substrate 6 common to the cell region 7. Therefore, in the temperature sense region 9, the temperature sense diode 20 is decreased in forward direction voltage $V_F$ in association with such a temperature rise. For example, as shown by a curve indicated by the dashed line in FIG. 8, a rising voltage of the temperature sense diode 20 is shifted to a low-voltage side. The short-circuit protection circuit 5 senses the decrease in forward direction voltage $V_F$ as occurrence of a short circuit in the switching element SW and turns off a voltage which is applied to the gate pad 3. Thereby, the drain current Id flowing between the source and the drain (S-D) of the switching element SW is cut off to protect the switching element SW.

As described so far, for example, when an overcurrent flows to the switching element SW due to a short circuit or the like, the temperature rise of the semiconductor substrate 6 by the overcurrent is detected based on the decrease in forward direction voltage $V_F$ of the temperature sense diode 20, and whether or not the overcurrent flows to the switching element SW can be determined on the basis of the above detection result. Further, a target to be monitored is not a sense current which flows to the switching element SW. Therefore, even where noise enters into the sense current to cause superimposition, there is no chance that the superimposition current is erroneously detected as an overcurrent. It is thus possible to reduce a malfunction resulting from current noise. Further, unlike a conventional overcurrent protection system, no certain waiting time (mask time) is provided or a short waiting time will suffice if provided. As a result, this overcurrent protection system is quite effectively used in a low on-resistance device (such as SiC and GaN) which will be broken by an overcurrent within a relatively short period of time.

Further, in this preferred embodiment, as shown in FIG. 5B, the temperature sense diode 20 is made of the polysilicon layer 21 which is the same as that of the gate electrode 17, thus making it possible to suppress an increase in the number of steps in defining the temperature sense diode 20. Still further, the temperature sense diode 20 can be disposed on the semiconductor substrate 6 via the gate insulating film 16 which is thinner than a relatively thick film such as the interlayer insulating film 18, etc. Therefore, a position of the temperature sense diode 20 can be brought immediately near a current channel on the surface of the semiconductor substrate 6. It is thereby possible to detect a change in temperature of the semiconductor substrate 6 with improved accuracy.

Figure 9A:
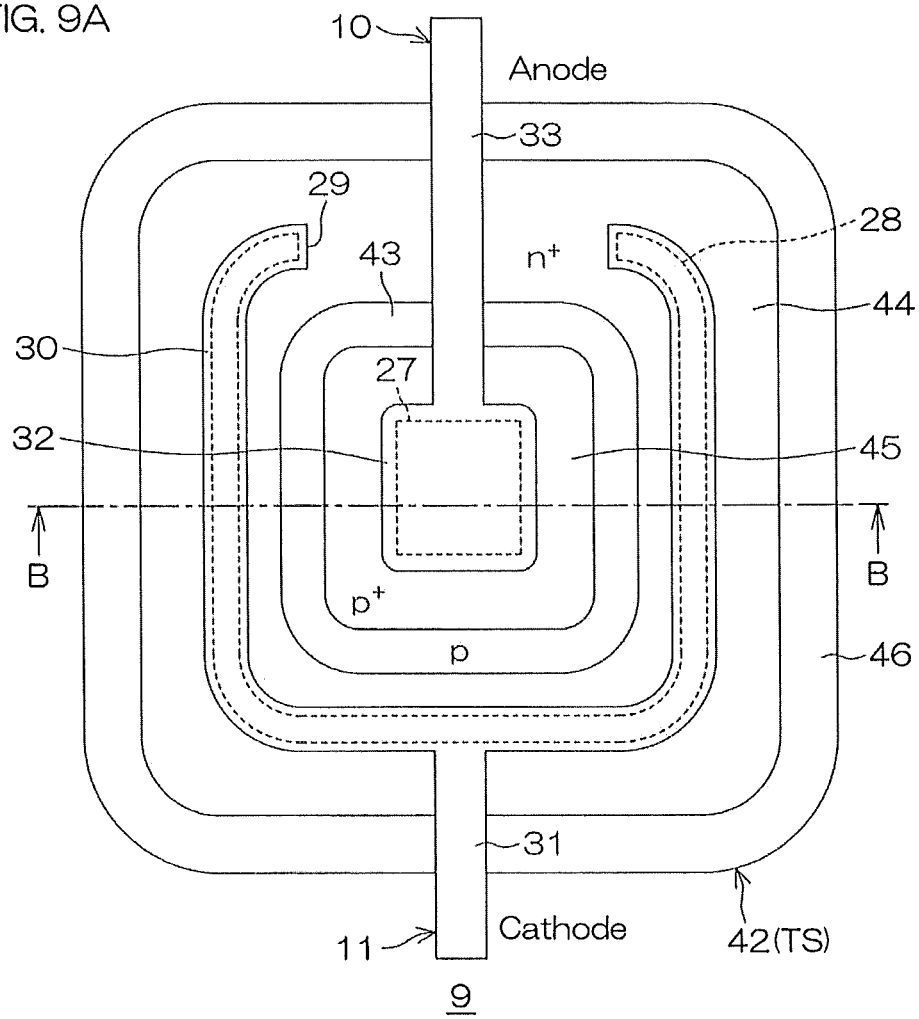
FIG. 9A is a schematic plan view which shows a structure of the temperature sense region of the semiconductor device of FIG. 3.
Figure 9B:
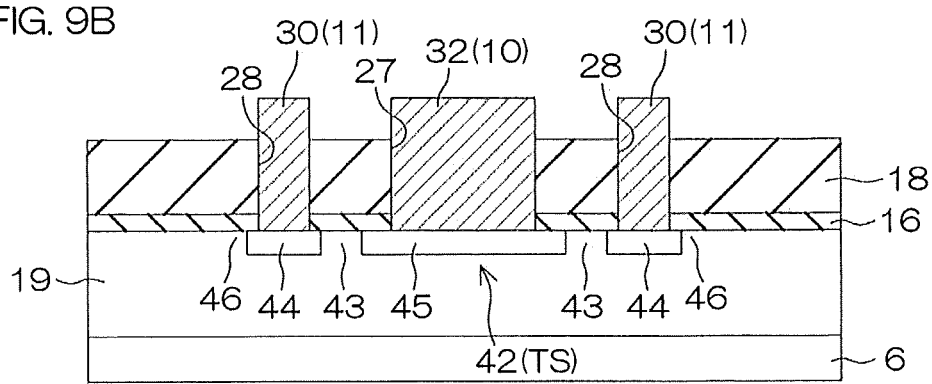
FIG. 9B is a sectional view of FIG. 9A (a sectional view taken along line B-B).

FIG. 9A is a schematic plan view which shows a structure of the temperature sense region 9 in the semiconductor device 1 of FIG. 3. FIG. 9B is a sectional view of FIG. 9A (a sectional view taken along line B-B). Each of FIG. 9A and FIG. 9B shows another example of the structure of the temperature sense region 9. In FIG. 9A and FIG. 9B, constituents which are the same as those previously described in FIG. 5A and FIG. 5B are given the same reference symbols, with a description thereof omitted here.

In FIG. 5A and FIG. 5B, the temperature sense diode 20 is made of the polysilicon layer 21 on the semiconductor substrate 6. A temperature sense diode 42 (pn diode) in FIG. 9A and FIG. 9B is made of an impurity region which is selectively defined on a surface portion of a semiconductor substrate 6. Specifically, the temperature sense diode 42 includes a p-type region 43 and an $n^+$-type region 44 which surrounds the p-type region 43 in a plan view. As long as such an arrangement is realized that the p-type region 43 is surrounded by the $n^+$-type region 44, the p-type region 43 is not overlapped with the $n^+$-type region 44 in a plan view. Therefore, the need for separately providing routing wiring or the like is eliminated, and contact can be easily provided both in the p-type region 43 and the $n^+$-type region 44.

The p-type region 43 is made of a part of a p-type region 19, whereas the $n^+$-type region 44 is defined in a state of floating on the surface portion of the p-type region 19. The $n^+$-type region 44 may be defined in the same step as that of an $n^+$-type source region 14 (refer to FIG. 4B). That is, the $n^+$-type region 44 may be from $1\times10^{18}$ cm$^{-3}$ to $5\times10^{21}$ cm$^{-3}$ in n-type impurity concentration as with the $n^+$-type source region 14, and may also be defined at the same depth.

The temperature sense diode 42 may also include a $p^+$-type contact region 45 and a p-type outer periphery region 46. The $p^+$-type contact region 45 is defined in an internal region of the p-type region 43, at an interval apart from a periphery of the p-type region 43, and the p-type outer periphery region 46 may be defined so as to surround the $n^+$-type region 44. The p-type outer periphery region 46 is made of a part of the p-type region 19 and electrically connected to the p-type region 43 via the p-type region 19 below the $n^+$-type region 44. On the other hand, the $p^+$-type contact region 45 is defined in a state of floating on the surface portion of the p-type region 19. The $p^+$-type contact region 45 may be defined in the same step as that of a $p^+$-type body contact region 15 (refer to FIG. 4B). That is, the $p^+$-type contact region 45 may be from $1\times10^{18}$ cm$^{-3}$ to $5\times10^{21}$ cm$^{-3}$ in p-type impurity concentration as with the $p^+$-type body contact region 15, and may also be defined at the same depth.

A first electrode 10 is connected to the $p^+$-type contact region 45 as an anode electrode via a contact hole 27 of an interlayer insulating film 18. A second electrode 11 is connected to the $n^+$-type region 44 as a cathode electrode via a contact hole 28 of the interlayer insulating film 18.

As described so far, the temperature sense diode 42 can be used also to perform a function similar to that of the temperature sense diode 20. Further, the temperature sense diode 42 is defined on a semiconductor substrate 6 itself. Therefore, a pn junction portion can be brought closer to a current channel on the surface of the semiconductor substrate 6 which is a heat generating portion than in the case of the temperature sense diode 20. It is thereby possible to detect a change in temperature of the semiconductor substrate 6 with high accuracy. Still further, a pn diode which is made of an impurity region favorably operates in a high temperature region (for example, a temperature of 200° C. or higher) and can be used especially effectively in a power device such as SiC and GaN in particular.

Next, a description will be given of a variation of connection modes where the plurality of temperature sense diodes 20, 42 are provided. Each of FIG. 10 to FIG. 14 is a drawing which shows one example of connection modes of the temperature sense diodes 20, 42. In addition, in FIG. 10 to FIG. 14, of the constituents shown in FIG. 5A and FIG. 9A, a reference numeral is given only to a constituent that is necessary in making a description.

First, as shown in FIG. 10, the plurality of temperature sense diodes 20, 42 may include a serial connection unit 47 which is arranged by connecting in series one of the first electrodes 10 (anode) and the other of the second electrodes 11 (cathode). As shown in FIG. 10, the serial connection unit 47 may be arranged by two temperature sense diodes 20, 42 or may be arranged by three or more temperature sense diodes 20, 42, although not illustrated.

Figure 8:
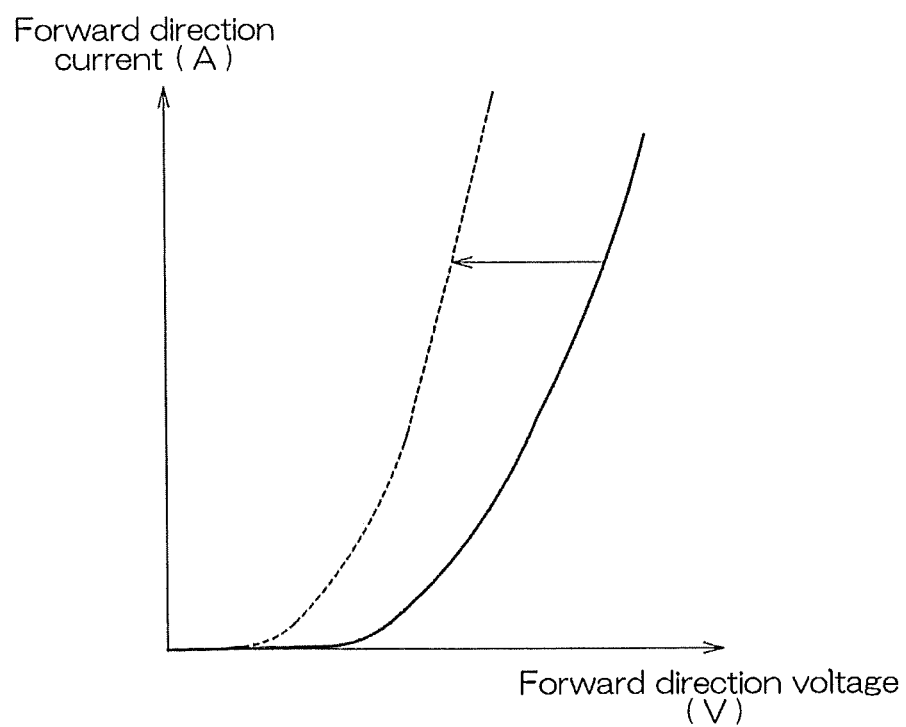
FIG. 8 is a graph which explains how a temperature sense diode undergoes a change in forward direction voltage with a change in temperature.

According to the arrangement of FIG. 10, a variation in temperature (shift amount) of forward direction voltage $V_F$ shown in FIG. 8 is increased in proportion to the number of connected temperature sense diodes 20, 42, by which it is possible to detect a change in temperature with an improved sensitivity. For example, when a forward direction voltage $V_F$ per temperature sense diode 20, 42 is XmV/° C. in deflection width, five of the temperature sense diodes 20, 42 are connected in series to arrange a serial connection unit 47, by which a deflection width of the serial connection unit 47 as a whole can be made into 5 XmV/° C.

Next, as shown in FIG. 11, at least one pair of serial connection units 47 may be connected in parallel so as to face each other in a reverse direction. That is, a first electrode terminal 10 of one of the serial connection units 47 may be connected to a second electrode terminal 11 of the other of the serial connection units 47 to give a terminal 48, while a second electrode terminal 11 of one of the serial connection units 47 may be connected to a first electrode terminal 10 of the other of the serial connection units 47 to give a terminal 49.

According to the arrangement of FIG. 11, the terminals 48, 49 of an aggregate of the temperature sense diodes 20, 42 which are combined into the plurality of serial connection units 47 are free of distinction of polarity between an anode side and a cathode side. Therefore, in assembling the semiconductor module 4 (refer to FIG. 2) or the like, wiring such as bonding wires can be improved in degree of freedom. That is, even when a reverse bias is applied to one of the serial connection units 47, at this time, a forward direction bias is applied to the other of the serial connection units 47. Thereby, at least one of them is allowed to function as a temperature sense diode.

Next, as shown in FIG. 12, the plurality of temperature sense diodes 20, 42 may include a reverse-series connection unit 50 which is arranged in such a manner that one of the first electrodes 10 (anode) is connected in series with the other of the first electrodes 10 (anode), or one of the second electrodes 11 (cathode) is connected in series with the other of the second electrodes 11 (cathode). As shown in FIG. 12, the reverse-series connection unit 50 may be arranged by two temperature sense diodes 20, 42 or may be arranged by three or more temperature sense diodes 20, 42, although not illustrated. Further, as shown in FIG. 13, the plurality of reverse-series connection units 50 may be connected in series in a reverse direction.

According to the arrangement of FIG. 12 and that of FIG. 13, of the temperature sense diodes 20, 42 which arrange the reverse-series connection unit 50, since a reverse bias is applied to at least one of them, the reverse-series connection unit 50 as a whole is increased in resistance. Therefore, it is possible to suppress an electric current necessary for monitoring a change in temperature of the temperature sense diodes 20, 42 and attain power saving.

Next, as shown in FIG. 14, the temperature sense diode 20, 42 may include an arrangement in which at least one pair thereof are connected in parallel in a reverse direction to each other. That is, a first electrode 10 of one of the temperature sense diodes 20, 42 may be connected with a second electrode 11 of the other of the temperature sense diodes 20, 42 to give a terminal 51, and a second electrode 11 of one of the temperature sense diodes 20, 42 may be connected with a first electrode 10 of the other of the temperature sense diodes 20, 42 to give a terminal 52.

According to the arrangement of FIG. 14, as with the arrangement of FIG. 11, the terminals 51, 52 of an aggregate of the temperature sense diodes 20, 42 are free of distinction of polarity between an anode side and a cathode side. Therefore, in assembling the semiconductor module 4 (refer to FIG. 2) or the like, wiring such as bonding wires can be improved in degree of freedom. That is, even when a reverse bias is applied to one of the temperature sense diode 20, 42, a forward direction bias is at this time applied to the other of the temperature sense diodes 20, 42. Therefore, at least, one of them is allowed to function as a temperature sense diode.

As described so far, a connection mode of the plurality of temperature sense diodes 20, 42 is not limited to the arrangement of each of FIG. 10 to FIG. 14 but any appropriate mode can be adopted. Further, concepts of the above-described connection modes (serial connection, serial connection+ reverse parallel connection, reverse-series connection, a plurality of reverse-series connections, reverse parallel connection, etc.) are also applicable to a temperature sense diode 66 of FIG. 16A to FIG. 16C which will be described later.

Figure 15A:
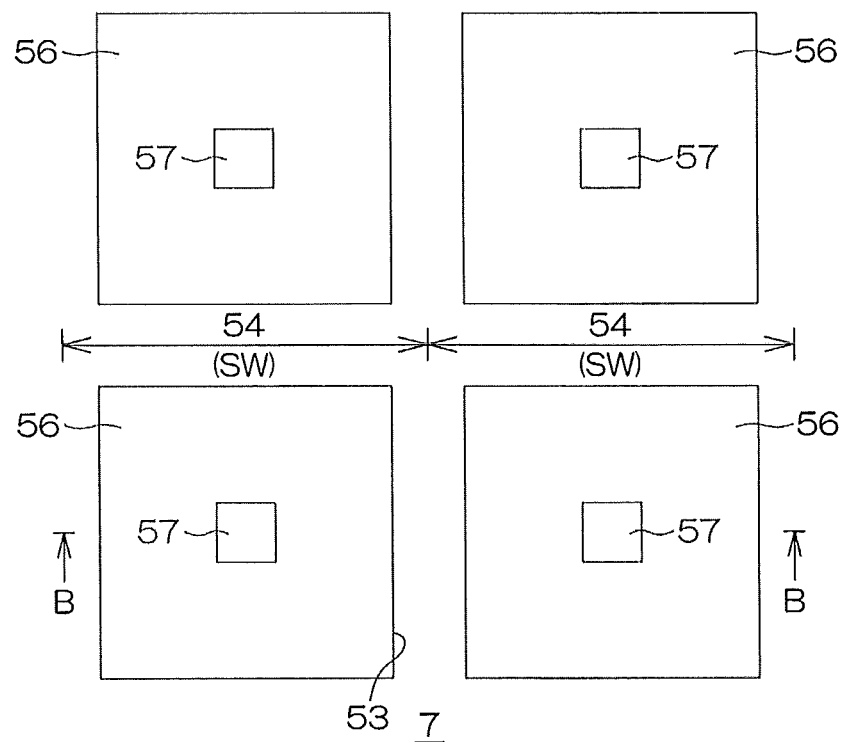
FIG. 15A is a schematic plan view which shows a structure of the cell region in the semiconductor device of FIG. 3.
Figure 15B:
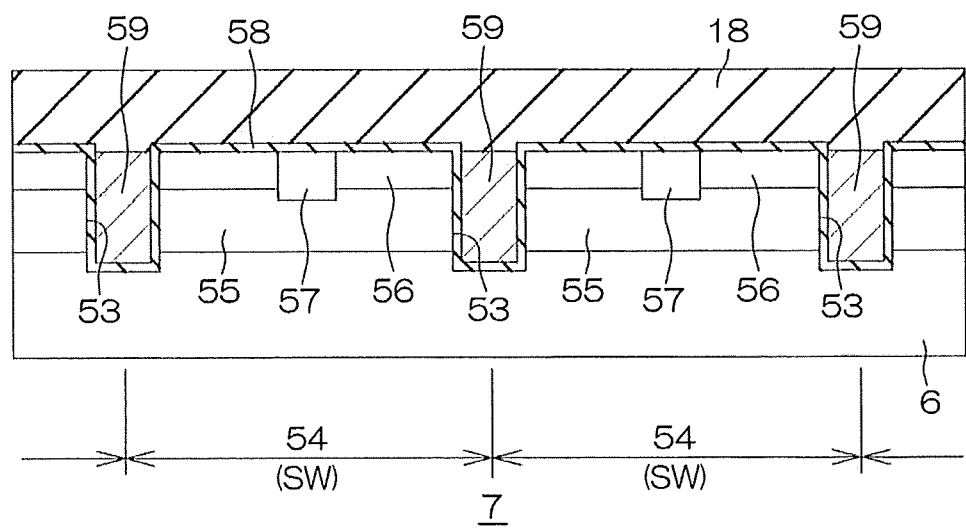
FIG. 15B is a sectional view of FIG. 15A (a sectional view taken along line B-B).

FIG. 15A is a schematic plan view which shows a structure (trench gate structure) of a cell region 7 of the semiconductor device 1 in FIG. 3. FIG. 15B is a sectional view of FIG. 15A (a sectional view taken along line B-B). Each of FIG. 15A and FIG. 15B shows another example of the structure of the cell region 7. In FIG. 15A and FIG. 15B, the same constituents as those previously described in FIG. 4A and FIG. 4B will be given the same reference numerals, with a description thereof omitted.

As shown in FIG. 15A and FIG. 15B, a gate trench 53 is defined on a semiconductor substrate 6 in a cell region 7. The gate trench 53 demarcates each of unit cells 54 in a switching element SW. The gate trench 53 may be defined, for example, in a lattice form in a plan view, as shown in FIG. 15A or may be defined in other forms such as a stripe form and a honeycomb form.

A p-type body region 55 is defined on a surface portion of each of the unit cells 54 and an n$^+$-type source region 56 is defined on a surface portion of the p-type body region 55. The p-type body region 55 may be, for example, from $1 \times 10^{15}$ cm$^{-3}$ to $1 \times 10^{20}$ cm$^{-3}$ in p-type impurity concentration. Further, the n$^+$-type source region 56 is higher in impurity concentration than the n-type semiconductor substrate 6 and may be, for example, from $1 \times 10^{18}$ cm$^{-3}$ to $5 \times 10^{21}$ cm$^{-3}$ in n-type impurity concentration.

A p$^+$-type body contact region 57 is defined in an internal region of the n$^+$-type source region 56. The p$^+$-type body contact region 57 is defined so as to penetrate through the n$^+$-type source region 56 in the depth direction. The p$^+$-type body contact region 57 is higher in p-type impurity concentration than the p-type body region 55 and may be, for example, from $1 \times 10^{18}$ cm$^{-3}$ to $5 \times 10^{21}$ cm$^{-3}$.

A gate insulating film 58 is defined on an inner surface of the gate trench 53 and on an surface of the semiconductor substrate 6. The gate insulating film 58 may be made of, for example, silicon oxide (SiO$_2$). The thickness of the gate insulating film 58 may be, for example, from 300 Å to 600 Å.

A gate electrode 59 is buried into the gate trench 53. The gate electrode 59 is opposed to the p-type body region 55 on a side of the gate trench 58, with the gate insulating film 58 held therebetween. Although the gate electrode 59 is made of, for example, n-type polysilicon (n-type doped polysilicon), it may be made of p-type polysilicon.

Figure 16B:
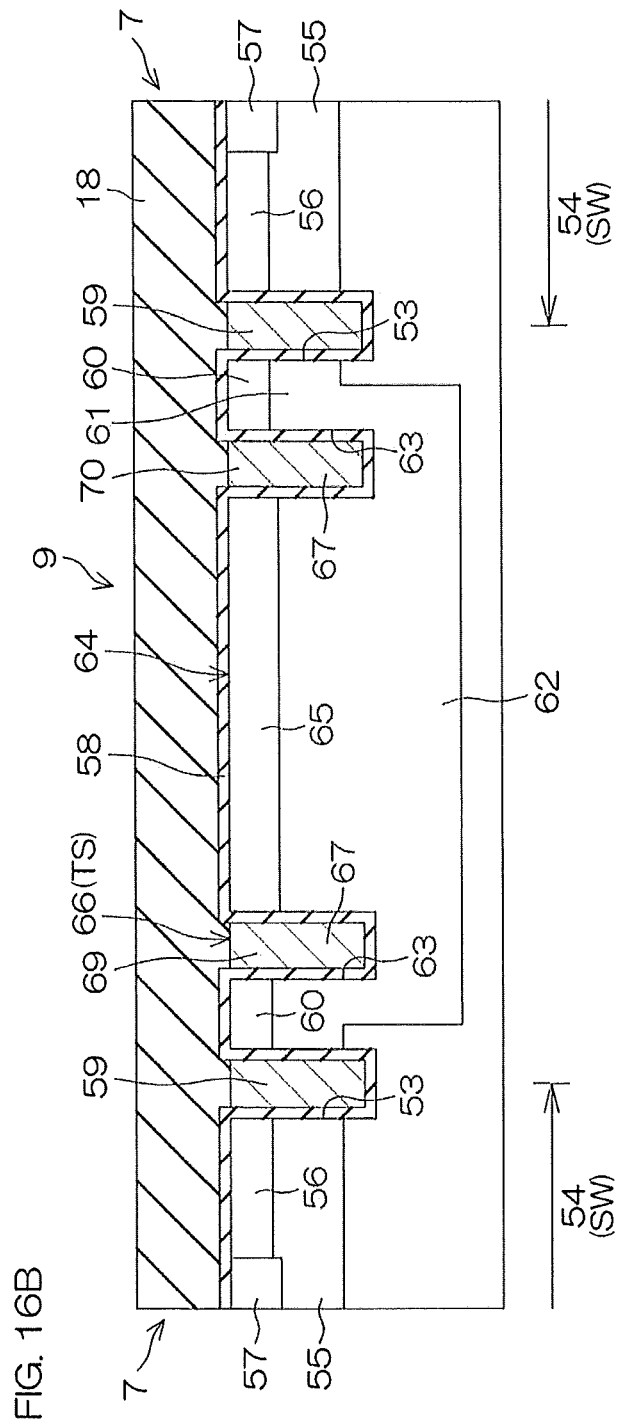
FIG. 16B is a sectional view of FIG. 16A (a sectional view taken along line B-B).
Figure 16C:
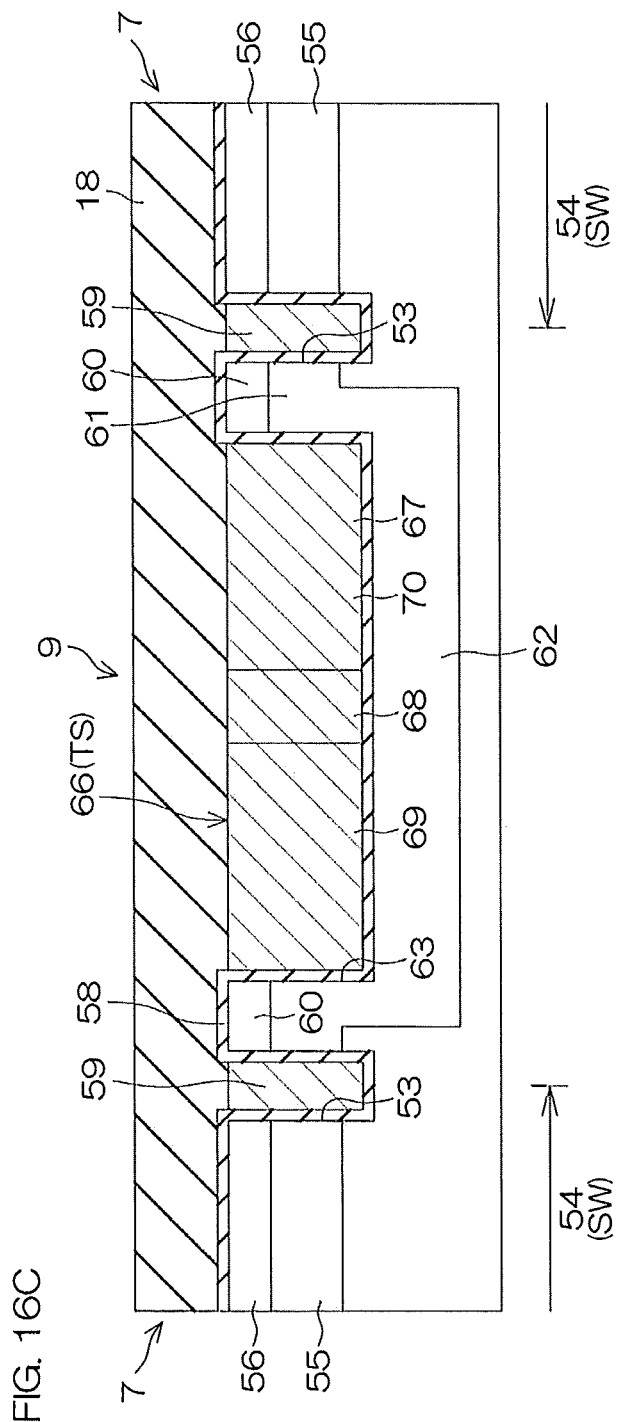
FIG. 16C is a sectional view of FIG. 16A (a sectional view taken along line C to C).

Next, a description will be given of a structure of a temperature sense region 9 where the cell region 7 is as shown in FIG. 15A and FIG. 15B. FIG. 16A is a schematic plan view which shows the structure of the temperature sense region 9 in the semiconductor device 1 of FIG. 3. FIG. 16B is a sectional view of FIG. 16A (a sectional view taken along line B-B). FIG. 16C is a sectional view of FIG. 16A (a sectional view taken along line C to C). In FIG. 16A to FIG. 16C, the same constituents as those described previously in FIG. 5A and FIG. 5B will be given the same reference numerals, with a description thereof omitted.

As shown in FIG. 16A to FIG. 16C, the temperature sense region 9 is demarcated by a gate trench 53 and a periphery thereof is surrounded by the gate trench 53. As shown in FIG. 16A, the temperature sense region 9 may be, for example, in a tetragonal shape in a plan view, the four sides of which are surrounded by the gate trench 53.

An $n^+$-type region 60 is defined on a surface portion of the semiconductor substrate 6 in the temperature sense region 9, and a p-type region 61 is defined below the $n^+$-type region 60. The p-type region 61 is in contact with the $n^+$-type region 60. The $n^+$-type region 60 may be equal to the $n^+$-type source region 56 in n-type impurity concentration and also at depth. Further, the p-type region 61 may be equal to the p-type body region 55 in p-type impurity concentration and also at depth. However, as shown in FIG. 16B and FIG. 16C, the p-type region 61 may be deeper than the p-type body region 55 and may be provided with a protrusion portion 62 which selectively protrudes below.

A temperature sense trench 63 as one example of the second trench of the present invention is defined in an internal region of the temperature sense region 9. That is, the temperature sense trench 63 is independent from the gate trench 53 which surrounds a periphery of the temperature sense region 9. The temperature sense trench 63 may be defined, for example, by the same width as that of the gate trench 53.

The temperature sense trench 63 may be defined so as to penetrate through the p-type region 62. However, as shown in FIG. 16B and FIG. 16C, the temperature sense trench 63 is defined on the protrusion portion 62, by which a bottom portion thereof may be disposed inside the p-type region 61 (the protrusion portion 62), without penetrating through the p-type region 61.

Further, the temperature sense trench 63 is annularly defined in a plan view, and a closed region 64 is demarcated inside the temperature sense trench 63. A $p^+$-type contact region 65 is defined in the closed region 64. The $p^+$-type contact region 65 may be defined on an entire surface of the closed region 64, as shown in FIG. 16A. Although not illustrated, the $p^+$-type contact region 65 may be selectively defined only partially in the closed region 64. The $p^+$-type contact region 65 may be equal to the $p^+$-type body contact region 57 in p-type impurity concentration and also at depth.

A gate insulating film 58 of the cell region 7 is defined on an inner surface of the temperature sense trench 63 by extending up to the temperature sense region 9. Then, a temperature sense diode 66 (pn diode) as an example of the temperature sense element TS is defined inside the gate insulating film 58.

The temperature sense diode 66 is made of a buried polysilicon layer 67 which is buried into the temperature sense trench 63. The temperature sense diode 66 made of the buried polysilicon layer 67 may be defined in the same step as that of the gate electrode 59 or may be defined in a step different from that of the gate electrode 59.

The temperature sense diode 66 includes a p-type region 68 and an $n^+$-type region 69 which is horizontally adjacent to the p-type region 68. That is, the p-type region 68 may be buried to a bottom of a certain region of the annular temperature sense trench 63, and the $n^+$-type region 69 may be buried to a bottom of a remaining region of the temperature sense trench 63 so as to be adjacent to the p-type region 68. As long as such as arrangement is realized that the p-type region 68 is horizontally adjacent to the $n^+$-type region 69, the p-type region 68 is not overlapped with the $n^+$-type region 69 in a plan view. Therefore, the need for separately providing routing wiring or the like is eliminated, and contact can be easily provided both in the p-type region 68 and the $n^+$-type region 69.

Further, the p-type region 68 may be, for example, from $1 \times 10^{15}$ cm$^{-3}$ to $1 \times 10^{20}$ cm$^{-3}$ (equal to the p-type body region 55) in p-type impurity concentration. The $n^+$-type region 69 may be, for example, from $1 \times 10^{18}$ cm$^{-3}$ to $5 \times 10^{21}$ cm$^{-3}$ (equal to the $n^+$-type source region 56) in n-type impurity concentration.

The temperature sense diode 66 may further include a $p^+$-type contact region 70. The $p^+$-type contact region 70 is defined so as to be in contact with the p-type region 68 but separated from the $n^+$-type region 69, at an interval apart from the p-type region 68. As shown in FIG. 16C, the $p^+$-type contact region 70 may be buried to a bottom of the temperature sense trench 63 and horizontally adjacent to the p-type region 68. Although not illustrated, at a position away from a border line between the p-type region 68 and the $n^+$-type region 69, the $p^+$-type contact region 70 may be selectively defined on a surface portion of the p-type region 68. Further, the $p^+$-type contact region 70 may be, for example, from $1 \times 10^{18}$ cm$^{-3}$ to $5 \times 10^{21}$ cm$^{-3}$ (equal to the $p^+$-type body contact region 57) in p-type impurity concentration.

In addition, the first electrode 10 of FIG. 3 is connected to the $p^+$-type contact region 70 as an anode electrode, while the second electrode 11 of FIG. 3 is connected to the $n^+$-type region 69 as a cathode electrode.

As described so far, the temperature sense diode 66 is also able to perform the same function as that of the temperature sense diode 20. Further, the temperature sense diode 66 (pn diode) is buried into the surface portion of the semiconductor substrate 6, by which a pn junction portion can be brought closer to a current channel on the surface of the semiconductor substrate 6 which is a heat generating portion than in the case of the temperature sense diode 20. It is thereby possible to detect a change in temperature of the semiconductor substrate 6 with high accuracy.

Although preferred embodiments of the present invention have been described above, the present invention may also be implemented in yet other modes.

For example, such an arrangement may be adopted that individual semiconductor parts of the semiconductor device 1 are reversed in conductivity. That is, in the semiconductor device 1, a p-type part may be an n-type and an n-type part may be a p-type.

Further, the temperature sense element TS may include a Schottky barrier diode, etc., in addition to the previously described temperature sense diodes 20, 42 (pn diode).

Further, the structure of the semiconductor device 1 may be applied to an IC such as LSI (Large-Scale Integrated circuit).

Various other design modifications can be made within the scope of matters described in the claims.

What is claimed is:

1. A semiconductor device, comprising:
a semiconductor chip having a first surface and a second surface and formed in a substantial square shape with four sides including a first side, a second side, a third side and a four side in a plan view;
a switching element that performs a switching operation between a first electrode formed on the first surface side and a second electrode formed on the second surface side according to a signal input to a control electrode formed on the first surface side;
a temperature sense element which is provided on the first surface side independently from the switching element, the temperature sense element having a third electrode capable of outputting electrical signals depending on temperature of the semiconductor chip and a fourth electrode arranged at a distance from the third electrode, wherein
the control electrode, the third electrode and the fourth electrode have substantially the same size and the same shape as one another,
the control electrode is arranged at a central portion of the first side of the semiconductor chip, and
the third electrode and the fourth electrode are arranged along the first side of the semiconductor chip and arranged at a one side with respect to the central portion of the first side.

2. The semiconductor device according to claim 1, wherein the first side and the second side face each other in the plan view,
the semiconductor device further comprises a gate finger extending from the first side to the second side and connected to the control electrode, and
the first electrode includes at least two regions between which the gate finger is sandwiched.

3. The semiconductor device according to claim 2, wherein the gate finger further extends across a central portion of the semiconductor chip.

4. The semiconductor device according to claim 1, wherein the temperature sense element includes a pn diode formed on the semiconductor chip.

5. The semiconductor device according to claim 4, wherein the temperature sense element includes a serial connection unit in which at least a pair of the pn diodes are connected in series.

6. The semiconductor device according to claim 4, wherein the pn diode includes a polysilicon layer containing impurities.

7. The semiconductor device according to claim 6, wherein the polysilicon layer forming the temperature sense element has the same thickness as the control electrode.

8. The semiconductor device according to claim 6, wherein the polysilicon layer forming the temperature sense element includes a base layer of a first conductivity type and an impurity region of a second conductivity type selectively formed on a surface of the base layer.

9. The semiconductor device according to claim 4, wherein the pn diode is formed in a temperature sense region between the third electrode and the fourth electrode.

10. The semiconductor device according to claim 4, further comprising a gate finger extending along a circumference of the semiconductor chip from the control electrode, wherein
an anode and a cathode of the pn diode are connected to the third electrode and the fourth electrode, respectively.

11. The semiconductor device according to claim 1, wherein the switching element includes a MISFET in which the first electrode includes a source electrode, the second electrode includes a drain electrode and the control electrode includes a gate electrode.

12. The semiconductor device according to claim 1, wherein the switching element includes a trench gate type MISFET which has a gate trench formed on the first surface of the semiconductor chip, and a gate electrode embedded in the gate trench and electrically connected to the control electrode.

13. The semiconductor device according to claim 1, wherein
the semiconductor chip includes a semiconductor substrate, a first semiconductor layer of a first conductivity type formed on a surface side of the semiconductor substrate, a second semiconductor layer of a second conductivity type formed on a surface of the first semiconductor layer, and a third semiconductor layer of the first conductivity type formed on a rear surface side of the semiconductor substrate, and
the switching element includes an IGBT in which the second semiconductor layer includes an emitter electrode which is connected to the first electrode, the third semiconductor layer includes a collector electrode which is connected to the second electrode, and the control electrode includes a gate electrode.

14. The semiconductor device according to claim 1, wherein the semiconductor chip includes a SiC semiconductor layer.

15. The semiconductor device according to claim 1, wherein
a first conductivity type region is formed on the first surface of the semiconductor chip such that the temperature sense element is formed in the first conductivity type region in a plan view, and
a trench having the same structure as the control electrode is formed between the temperature sense element and the switching element such that the first conductivity type region is surrounded by the trench.

16. The semiconductor device according to claim 1, further comprising:
a first terminal and a second terminal connected to the first electrode and the second electrode, respectively; and
a third terminal and a fourth terminal connected to the third electrode and the fourth electrode, respectively.

* * * * *